(12) United States Patent
Williams et al.

(10) Patent No.: US 6,239,463 B1
(45) Date of Patent: May 29, 2001

(54) LOW RESISTANCE POWER MOSFET OR OTHER DEVICE CONTAINING SILICON-GERMANIUM LAYER

(75) Inventors: Richard K. Williams, Cupertino; Mohamed Darwish, Campbell; Wayne Grabowski, Los Altos; Michael E. Cornell, Campbell, all of CA (US)

(73) Assignee: Siliconix incorporated, Santa Clara, CA (US)

( * ) Notice: Subject to any disclaimer, the term of this patent is extended or adjusted under 35 U.S.C. 154(b) by 0 days.

(21) Appl. No.: 08/919,386

(22) Filed: Aug. 28, 1997

(51) Int. Cl.[7] .......................... H01L 29/76; H01L 29/94; H01L 31/062; H01L 31/113; H01L 31/119

(52) U.S. Cl. .................. 257/328; 257/329; 257/330; 257/331; 257/332; 257/334; 257/341; 257/342; 438/206; 438/212

(58) Field of Search .......................... 257/341, 342, 257/329, 330, 332, 331, 334, 328; 438/206, 212

(56) References Cited

U.S. PATENT DOCUMENTS 5,072,266  12/1991  Bulucea et al. .
5,801,396 * 9/1998  Chan et al. ............... 257/65
5,821,136 * 10/1998  Chan et al. ............... 438/158
5,985,708 * 11/1999  Nakagawa et al. ........ 438/206

FOREIGN PATENT DOCUMENTS

406268208 * 9/1994 (JP) .

* cited by examiner

*Primary Examiner*—William Mintel
(74) *Attorney, Agent, or Firm*—Skjerven Morrill MacPherson LLP; David E. Steuber

(57) ABSTRACT

A power MOSFET or other semiconductor device contains a layer of silicon combined with germanium to reduce the on-resistance of the device. The proportion of germanium in the layer is typically in the range of 1–40%. To achieve desired characteristics the concentration of germanium in the Si-Ge layer can be uniform, stepped or graded. In many embodiments it is desirable to keep the germanium below the surface of the semiconductor material to prevent germanium atoms from being incorporated into a gate oxide layer. This technique can be used in vertical DMOS and trench-gated MOSFETs, quasi-vertical MOSFETs and lateral MOSFETs, as well as insulated gate bipolar transistors, thyristors, Schottky diodes and conventional bipolar transistors.

60 Claims, 32 Drawing Sheets

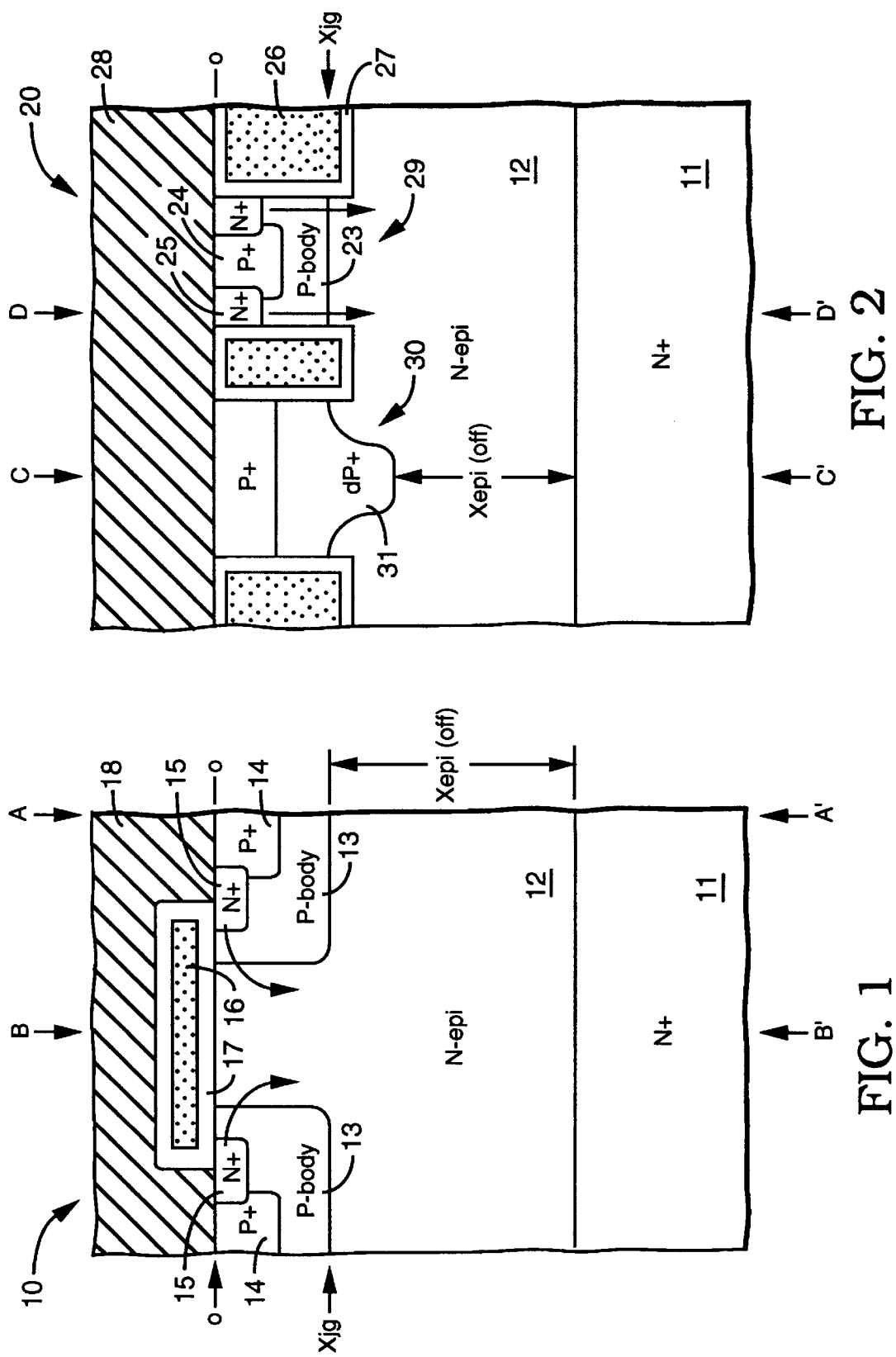

LOW RESISTANCE POWER MOSFET OR OTHER DEVICE CONTAINING SILICON-GERMANIUM LAYER

FIELD OF THE INVENTION

This invention relates to power MOSFETs and in particular to power MOSFETs in which an important criterion of performance is the resistance of the MOSFET when it is turned on.

BACKGROUND OF THE INVENTION

The resistance of a vertical power MOSFET has several components: the resistance of the channel, the resistance beyond the channel where the current is spreading out, the resistance in a relatively lightly-doped epitaxial layer which is normally a part of these devices, and the resistance of the heavily-doped substrate. In addition, vertical double-diffused (DMOS) devices with planar channels (known as planar VDMOS) have an additional component of resistance that is due to the crowding of the current between the depletion regions that surround the body regions.

FIGS. 1–11 illustrate several aspects of these resistance components. FIGS. 1 and 2 show cross-sectional views of two classes of vertical MOSFETs each of which includes an N-epitaxial (epi) layer 12 which is grown on an N+ substrate 11, which functions as the drain. FIG. 1 shows a planar DMOS 10 including P-body regions 13, P+ body contact regions 14, and N+ source regions 15. A gate 16 is formed over the top surface of the epi-layer 13 and is separated from the top surface by an oxide layer 17. The N+ source regions 15 are contacted by a metal layer 28 which also forms a short between the N+ source regions 15 and the P+ body contact regions 14 and thereby prevents the parasitic NPN bipolar transistor from turning on. As shown by the arrows, when the device is turned on current flows from the N+ source regions 15, laterally through channel regions in the P-body regions 13 and then downward through the N-epi layer 12 to the N+ substrate 11 (drain).

MOSFET 20 shown in FIG. 2 is a trench-gated MOSFET in which a gate 26 is formed in a trench and is separated from the N-epi layer 12 by an oxide layer 27. The gate trenches typically form a lattice or array of cells which in FIG. 2 includes a MOSFET cell 29 and a diode cell 30. MOSFET cell 29 includes a P-body region 23, a P+ body contact region 24, and an N+ source region 25. N+ source region 25 and P+ body contact region 24 are contacted and shorted together by a metal layer 28. As shown by the arrows, when the device is turned on currents flow from the N+ source region 25 downward through channel regions adjacent the walls of the trenches, through the N-epi layer 12 and into the N+ substrate (drain).

Diode cell 30 includes a deep P+ diffusion 31 which ensures that voltage breakdown occurs away from the trench walls. Impact ionization near the trench walls could cause hot carriers to be injected into and damage the gate oxide 27. Preferably there is a diode cell for a given number of MOSFET cells as taught in application Ser. No. 08/459,555, filed Jun. 2, 1995, which is incorporated herein by reference. Alternatively, the deep P+ diffusion could be included within the MOSFET cell 29 as taught in U.S. Pat. No. 5,072,266 to Bulucea et al.

As the carriers (electrons) drift through the N-epi layer 12 in MOSFETs 10 and 20 a voltage develops across N-epi layer 12 (sometimes referred to as a "drift" region). The magnitude of this voltage depends on the thickness of and dopant concentration in N-epi layer 12, which are normally chosen in a compromise to provide a variety of features and characteristics for the device. In particular the thickness and dopant concentration are selected to provide a particular blocking voltage when the device is turned off. Generally speaking, the lower the dopant concentration and the thicker the N-epi layer 12 (between the top interface of the N+ substrate 11 and a P-type region), the higher the blocking voltage. In FIG. 1 $X_{epi}$(off) designates the vertical distance between the N+ substrate 11 and the lower boundary of P-body region 13, and in FIG. 2 $X_{epi}$(off) designates the vertical distance between the N+ substrate 11 and the lower limit of deep P+ diffusion 31. In each case $X_{epi}$(off) represents the thickness of N-epi layer 12 that must support the voltage across the device when it is turned off. Note also in FIGS. 1 and 2 that $X_{jB}$ designates the level of the lower junction of the P-body regions 13,23 relative to the surface of the epi-layer, which is labeled zero. In FIG. 1 $X_{jB}$ coincides with the beginning of $X_{epi}$; in FIG. 2 $X_{epi}$(off) is not referenced to $X_{jB}$.

The cross-sections AA' in FIG. 1 and CC' in FIG. 2 correspond to diodes which are formed at the junction of N-epi layer 121 and P-body region 13 and deep P+ diffusion 31, respectively. The cross-sections BB' and DD' designate the regions in which the current flows vertically through the N-epi layer 12.

The diodes at cross-sections AA' and CC' are represented generally by a diode 32 on the left side of FIG. 3 which shows a P or P+ region 33, an N+ region 35 and an intervening N-epi layer 34 (referred to as a PN or PIN avalanche clamp). The thickness of the N-epi layer 34 is designated $X_{epi}$(net). The right side of FIG. 3 shows a graph of the strength of the electric field (E=dV/dx) in the diode 32. The electric field reaches a peak at the junction of P or P+ region 33 and N-epi layer 34 and then drops with increasing depth. If N-epi layer 34 is relatively heavily doped, the electric field (curve labeled PN) drops over a short distance; if N-epi layer 34 is lightly doped the electric field (curve labeled PIN(reachthrough)) is relatively flat indicating that the depletion region extends all the way to N+ substrate 35; if N-epi layer 34 is doped to an intermediate level the electric field (curve labeled PνN(reachthrough)) the depletion region again reaches through the entire N-epi layer 34 but the electric field is not flat across the entire layer 34. Rather, in the last case the electric field slopes to some degree until it reaches the N+ region 35. Neither the P or P+ region 33 nor the N+ region 35 can support any significant electric field. Since the breakdown voltage is roughly equal to the integral of the electric field over the interval $X_{epi}$(net), it is apparent that the area under the triangle or trapezoid gives a rough estimate of the voltage of the device.

Thus if the N-epi-layer 34 is made thinner or doped more heavily, the breakdown voltage is reduced. On the other hand, a thinner, more heavily doped epi layer has a lower resistance when the device is turned on. A variety of techniques have been used to optimize the device by fabricating the thinnest possible, most heavily doped epi-layer that still provides an adequate breakdown voltage. All of these variations are only a few percentage points apart in terms of what is needed to provide the optimal doping/thickness combination to meet and support the required breakdown voltage.

FIG. 4 illustrates a graph that is available from many sources showing the "reach-through" breakdown voltage of a PIN diode as a function of the "background" doping concentration of the intermediate layer ($C_B$) for various intermediate layer thicknesses (designated as $W_{EPI}$, which in this particular publication is equivalent to $X_{epi}$(off) in FIGS.

1 and 2). The graph of FIG. 4 is taken from Semiconductor Technology Handbook, Technology Associates, page 8–9 (1980). If $W_{EPI}$ is an infinite thickness, there is a one-to-one correspondence between the background dopant concentration and the breakdown voltage. Since FIG. 4 is plotted on log-log paper, this implies a strong dependence between the dopant concentration and breakdown voltage. If the background concentration is increased two orders of magnitude from $10^{15}$ cm$^{-3}$ to $10^{17}$ cm$^{-3}$, for example, the breakdown voltage falls from about 300 V to about 15 V. If the intermediate layer is made thinner, then ultimately the breakdown voltage becomes independent of background concentration and varies only with the thickness of the intermediate layer. Between these extremes there is a region where the plots are curved, indicating that the breakdown voltage is a result of both the background concentration and intermediate layer thickness.

Reducing the thickness and increasing the dopant concentration of the intermediate layer improves the on-resistance of the device but, as indicated by FIG. 4, this would also reduce the device's breakdown voltage. Furthermore, in designing a MOSFET a 20–25% variation in the epi layer thickness and a 10–20% variation in the dopant concentration must be anticipated. Accordingly, to guarantee a desired breakdown voltage one must design the device to have a thicker epi layer and a lower dopant concentration. For example, according to FIG. 4, to design a 60 V device $X_{epi}$(off) could be as low as about 2 µm, and the dopant concentration at that thickness could be as high as about $5 \times 10^{15}$ cm$^{-3}$. Alternatively, the epi doping could be increased beyond $1.2 \times 10^{16}$ cm$^{-3}$ but the thickness would have to exceed 0.3 µm to meet a 60 V breakdown specification. However, to take account of manufacturing variations $E_{fepi}$(off) would have to be designed to be in the range of 2 to 4 µm (i.e., 3±1 µm) and the dopant concentration would have to be designed to be in the range of $4 \times 10^5$ cm$^{-3}$. Such a combination represents the points of the thinnest epi (2 µm) curve where the breakdown voltage does not vary substantially with doping. In this approach a 20% increase in resistivity at the thinnest (2 µm) epi would just barely meet the target breakdown voltage.

FIG. 5 is a cross-section showing a portion of an N-epi layer 50 and an N+ substrate 51. The upper boundary of N-epi layer 50 is designated $X_{jB}$, and the thickness of N-epi layer 50 is $X_{epi}$(on). N-epi layer 50 has a dopant concentration $N_{epi}$ and a corresponding resistivity $\rho_{epi}$. Ignoring the resistance in the region above $X_{jB}$ and in the N+ substrate 60, the resistance of N-epi layer 61 (which is treated as the "drain resistance" $R_D$), is then $$R_D = \frac{\rho_{epi} X_{epi}(on)}{A}$$

where A is the area. Normalizing the resistance by area yields:

$$R_D \cdot A = \rho_{epi} X_{epi}(on)$$

Thus the product $R_D A$ is the quantity (the specific on-resistance) that is to be minimized. Applying the data of FIG. 4 to $R_D A$ (i.e., considering only the resistance of the N-epi layer 61) yields the graph of FIG. 6, which plots $R_D A$ as a function of the breakdown voltage BV(rated) for N-channel and P-channel devices. FIG. 6 is taken from R. K. Williams and R. Blattner "Benefits of DMOS Voltage Scaling On Synchronous Buck Regulator Efficiency", 1993 International Symposium on Semiconductor Devices, pp. 146–151. One general conclusion of that article is that the optimal solution yields a curve of E vs.x which is similar to the trapezoidal curve PvN(reachthrough) shown in FIG. 3. The optimal breakdown voltage is in the range of 20–30 V/µm, depending on the dopant concentration. If the silicon is doped more heavily and is thicker than the minimum reachthrough thickness, the breakdown voltage is closer to 30 V/µm; if the silicon is doped more lightly the breakdown voltage is closer to 20 V/µm. FIG. 6 shows curves for $R_D A$ both with and without the substrate. As expected, the values of the coefficients in an equation for ionization rate vary with the author and the fabricated devices. Since the breakdown voltage depends on both doping and thickness, the minimum thickness and maximum doping for a given breakdown voltage decrease with doping despite the fact that the critical electrical field is increasing. The curve labelled Hu[2] in FIG. 6 illustrates the effect of these constants on the breakdown vs. concentration curve. See also, Baliga, *Power Semiconductor Devices*, pp. 376 et seq., (1996).

FIG. 7 shows pictorially the total drain-to-source resistance $R_{DS}$ in a planar DMOSFET. $R_{channel}$ is the channel resistance, $R_{JFET}$ is the resistance in the JFET region where the current is squeezed between the depletion regions surrounding the body-drain junctions, $R_{spreading}$ is the resistance in the region where the current is spreading out, $R_{epi}$ is the resistance in the remainder of the epi layer, and $R_{substrate}$ is the resistance of the substrate. As shown in FIG. 8, the total resistance of a trench-gated MOSFET is similar except that there is no $R_{JFET}$. As a result, the trenchFET can be fabricated in higher cell densities than the planar DMOSFET. For example, the trenchFETs shown in FIGS. 9A and 9B, which contain a central deep diffusion as taught in the above-referenced U.S. Pat. No. 5,072,266 to Bulucea et al., can be fabricated to a density of about 12 million cells per square inch. If the technique taught in the above-referenced application Ser. No. 08/459,555 is used the density can be increased to about 32 million cells per square inch.

Getting a greater cell density alone is not enough. The critical parameter is the total channel width per unit area W/A (typically inverted as the packing coefficient A/W). Since the channel lies along the wall of the trench, the perimeter of each cell times the number of cells gives the total channel width. FIGS. 10A, 10B and 10C give the formulas for A/W for a trenchFET containing square, hexagonal and striped cells, respectively. Ysb is the length of a side of the cell and Yg is the length of the gate. In FIG. 10C, Z is the length of the stripe. A/W for the square and hexagonal cells is identical, and so long as the gate is smaller than the source-body region between the gates the square or hexagonal cell is better. Only if the regions between the gate are smaller than the gate is the striped configuration better.

For a trenchFET the normalized drain-to-source resistance $R_{DS}A$ is equal to the normalized channel resistance plus the normalized drain resistance ($R_{JFET}$ being zero).

$$R_{DS} A = R_{ch} W \cdot \frac{A}{W} + R_D A$$

$R_{Ch}W$ can be expressed as:

$$R_{ch} W = \frac{1 + \theta \cdot (V_{GS} - V_t)}{\frac{\mu_s}{L} \cdot \frac{\varepsilon_{ox}}{x_{ox}} \cdot (V_{GS} - V_t)}$$

This essentially means that if the gate oxide is made thinner ($\varepsilon_{ox}/x_{ox} = C_{ox}$ is greater) there is greater coupling to the channel and the channel resistance is lower. This incidentally has the complication of changing the threshold voltage unless the channel doping is adjusted in concert with oxide scaling.

Thus the channel resistance can be reduced by either thinning the gate oxide or improving A/W.

The remaining term is $R_DA$ which is expressed as:

$$R_DA = \xi \cdot x_{epi} \cdot \rho_{epi} + x_{sub} \cdot \rho_{sub}$$

where $x_{epi}$ and $x_{sub}$ represent the vertical distance through the epi layer and the substrate, respectively, and $\rho_{epi}$ and $\rho_{sub}$ represent the resistivity of the epi layer and substrate, respectively. $\xi$ is a correction factor at account for current spreading in some portion of the epi layer.

FIG. 11 is a graph showing the total normalized on-resistance as a function of the normalized gate oxide thickness for different levels of gate voltage in excess of the threshold voltage ($V_{GS}$–Vt). The term ($V_{GS}$–$V_t$) is useful to eliminate the influence of process parameters on the threshold voltage when comparing the performance of various devices. This "overdrive" keeps the voltage beyond threshold constant so that other terms can be separated for analysis. In so doing the resistance in the epi layer and substrate can be separated from the channel term as $X_{OX} \rightarrow 0$ and $R_{Ch}W \rightarrow 0$. As the gate oxide thickness approaches zero the normalized resistance approaches a theoretical limit comprising the epi and substrate resistance which in this example is about 0.75 (i.e., 75%) of the total resistance of a reference device operated at a gate drive of 10 V above Vt, or around 12 V. Thus one can vary the gate oxide thickness and cell density to minimize the channel resistance but the resistance of the epi layer and substrate remain. For high voltage devices (e.g., 500 V) there is little reason to increase the cell density because so much of the resistance is attributable to the thick epi layer that is required to support a high breakdown voltage. Even for low voltage devices, eventually one runs into the limit represented by the resistance of the epi layer and substrate. In every case eventually the epi resistance becomes the dominant factor.

There is a great need for MOSFETs capable of handling voltages of 10 V up to 100 V or even 500 V and which have low on-resistances.

A different class of power devices is represented by the lateral MOSFET 120 shown in FIG. 12. MOSFET 120 is formed in a P-substrate or P-epi layer 121 and includes an N+ source 122, an N+ drain 123 and a P+ body contact region 124. A gate 125 is separated from a channel region by a gate oxide layer 126. The gate 125 can vary from 0.25 to 20–30 $\mu$m in length, and the longer the channel the higher the on-resistance of the device. The on-resistance may be reduced by decreasing the gate oxide thickness, but eventually this is limited by the need to maintain a desired breakdown voltage. In many cases, to maintain the breakdown voltage at a desired level either the gate oxide has to be kept above a minimal thickness (otherwise the oxide between the N+ drain and the gate oxide will rupture) or a lightly doped drain extension has to be interposed between the gate and drain. Since these devices are commonly used in logic circuits, the higher on-resistance and lower transconductance and consequent slower speeds that result from these techniques to achieve a higher breakdown voltage present problems. So aside from thinning the oxide, decreasing resistance and improving transconductance must be accomplished in another way.

One solution to this problem, illustrated in FIG. 13A, is to form a thin silicon-germanium layer 127 immediately under the gate oxide layer 126, in the region of the channel. Layer 127 is a crystal that is a composite of silicon and germanium atoms wherein the germanium atoms might represent as much as 10% to 20% of the total number of atoms in the crystal lattice. Silicon and germanium are both Group IV elements and bond together covalently. For example, at a ratio of 10% one out of every ten atoms would be germanium and nine would be silicon. Layer 127 must be very thin—e.g., from 10 Å to a few thousand Å at most—and it is doped at a concentration which is much lower (e.g., $10^{13}$ or $10^{14}$ cm$^{-3}$) than the concentration of a typical channel region (e.g., $10^{17}$ cm$^{-3}$). FIG. 13B shows a graph of a the doping concentration and percentage of germanium as a function of the depth below the surface.

As a result of the difference in the energy band gap between silicon and silicon-germanium, carriers fall down an energy "hill" into the Si-Ge layer 127, which ideally is a lightly-doped layer. This is shown in FIG. 13C, which is a diagram showing the lowest conduction band energy $E_c$ in the germanium and silicon regions. Highly doped regions generally have low carrier mobility because the charge carriers are more likely to collide with each other. This produces scattering and energy in the form of heat. In the lightly doped Si-Ge layer, owing to the lower dopant concentration, the mobility of the carriers is much greater than it is in the silicon. Thus Si-Ge layer 127 functions as a tube or tunnel of very light dopant concentration which has a very high carrier mobility. The mobility of this layer is improved not only because of the presence of germanium (which has a higher mobility than silicon) but because the thin channel region is very lightly doped and therefore exhibits very little scattering due to interactions between the dopant (ions) and the channel carriers.

While numerous crystal defects are created by the mismatch between silicon and silicon-germanium, Si-Ge layer 127 is so thin that it is able to deform elastically to accommodate the more rigid underlying silicon. Si-Ge layer 127 must be very thin or the device will have a great deal of leakage and other undesirable properties. It should be noted that in the embodiment shown in FIGS. 13A–13C germanium is used to improve the channel mobility. This is an entirely different matter from the bulk drain resistance.

A thin Si-Ge layer has also been used to increase the carrier mobility in high electron mobility bipolar transistors (HEMTs), where it is used with a very narrow base region and polysilicon emitter. Again, the idea is to use the quantum mechanical effect of carriers falling into an energy well having a high mobility. FIG. 14 shows an HEMT 140 including an N-type polysilicon emitter 141, a P-type base 142, a Si-Ge layer 143 and an N-well 144 which serves as the collector of HEMT 140.

Neither of these applications addresses the problem of reducing the on-state resistance of a power MOSFET since, as described above, that resistance arises mainly in epitaxial or drift region of the device, not solely the channel. In the thin Si-Ge layer devices, moreover, the mobility in the Si-Ge layer is compared with the mobility in surface channel of silicon, which is already reduced to one-half or one-third of the mobility of bulk silicon. The significant improvement in mobility occurs not only because conduction is taking place in lightly doped regions but also because the concentration of the germanium can be tailored such that the carriers are "sucked" slightly below the surface. Therefore, scattering at the surface is avoided. In essence, the phenomenon is one of surface mobility and how to improve it by invoking partial bulk conduction, not properties in a bulk material. What is needed is a bulk material which contributes low resistance but supports a relatively high breakdown voltage. While wide bandgap semiconductors such as silicon carbide can offer such a benefit at high voltages and temperatures, devices using SiC are less efficient than even silicon at room temperature.

SUMMARY

In accordance with this invention the on-state resistance of a transistor is reduced by forming a Si-Ge layer in the path of current flow (but outside the channel region). The Si-Ge layer reduces the on-resistance of the device without unduly affecting the breakdown voltage. The mole-fraction of germanium in the Si-Ge layer is typically in the range from about 5% to about 40%.

One class of embodiments comprises vertical power MOSFETs, wherein a Si-Ge epitaxial (epi) layer is formed over a silicon substrate. The Si-Ge epi layer can extend to the top surface of the semiconductor material or it can be overlaid on a layer of silicon to prevent the deleterious effects of germanium getting incorporated into the gate oxide layer. The Si-Ge layer can have a uniform concentration or it can be graded or stepped to achieve desired characteristics. The vertical power MOSFET may take the form of a planar DMOSFET or a trench-gated MOSFET.

A second class of embodiments include trench-gated MOSFETs which include a Si-Ge layer and may use the SiGe layer to determine the location of avalanche breakdown.

A third class of embodiments include quasi-vertical devices in which the drain is represented by a buried layer that is linked to the surface by means of a vertical diffusion such as a sinker region.

A fourth class of embodiments include lateral devices which include a Si-Ge layer that represents a relatively low-resistance path and diverts current from the normal current path.

A Si-Ge layer according to this invention can also be used with other devices such as Schottky diodes, bipolar transistors, insulated gate bipolar transistors and thyristors. In devices which rely on current modulation the Si-Ge layer can allow faster switching times and prevent latch-up, taking advantage of reduced minority carrier lifetimes.

BRIEF DESCRIPTION OF THE DRAWINGS

FIG. 1 shows a cross-sectional view of a conventional vertical planar DMOSFET.

FIG. 2 shows a cross-sectional view of a conventional trench-gated MOSFET.

DESCRIPTION OF THE INVENTION

Figure 15:
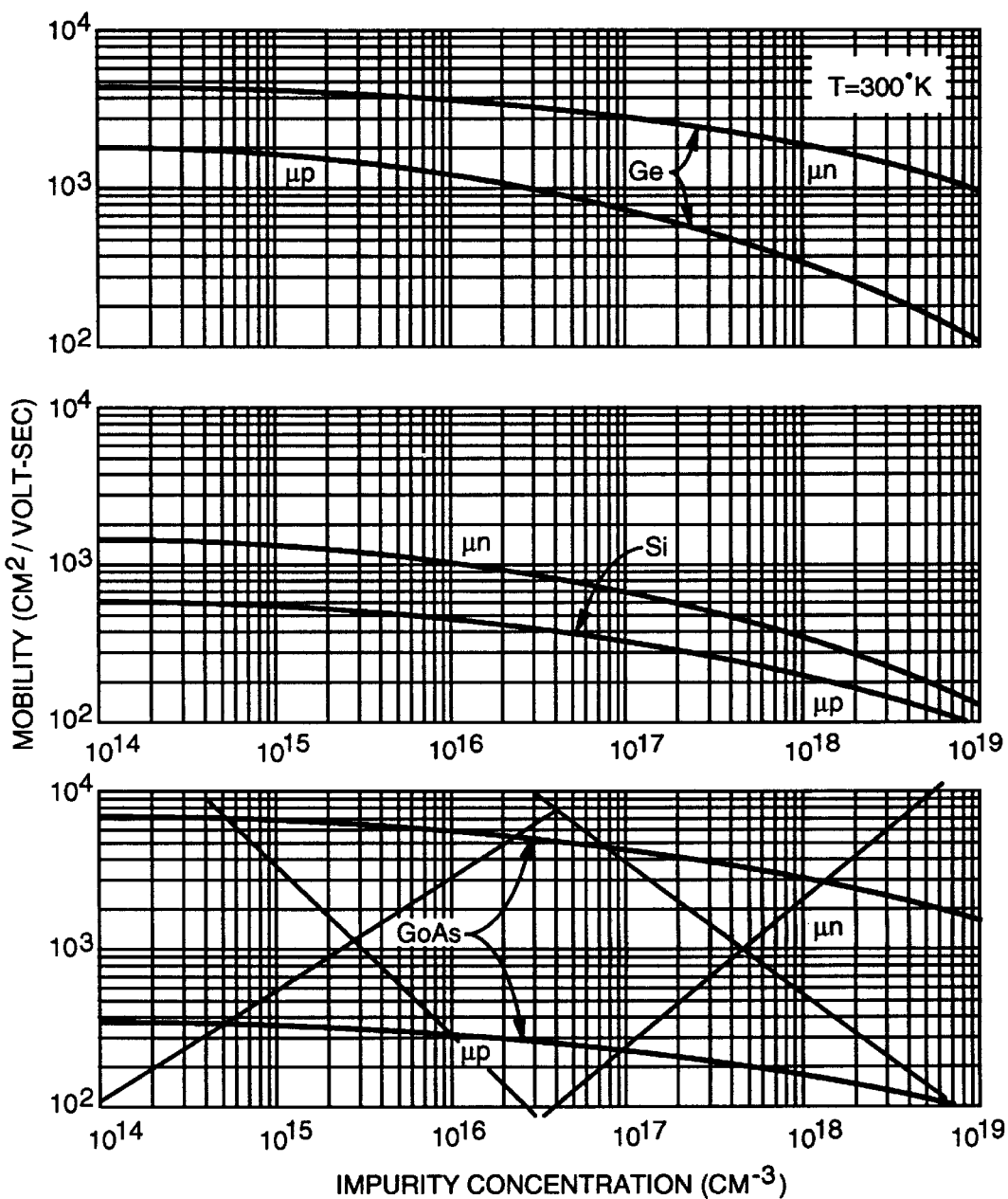
FIG. 15 shows a graph of the mobility of silicon and germanium as a function of dopant concentration, for both N-type and P-type material.
Figure 16:
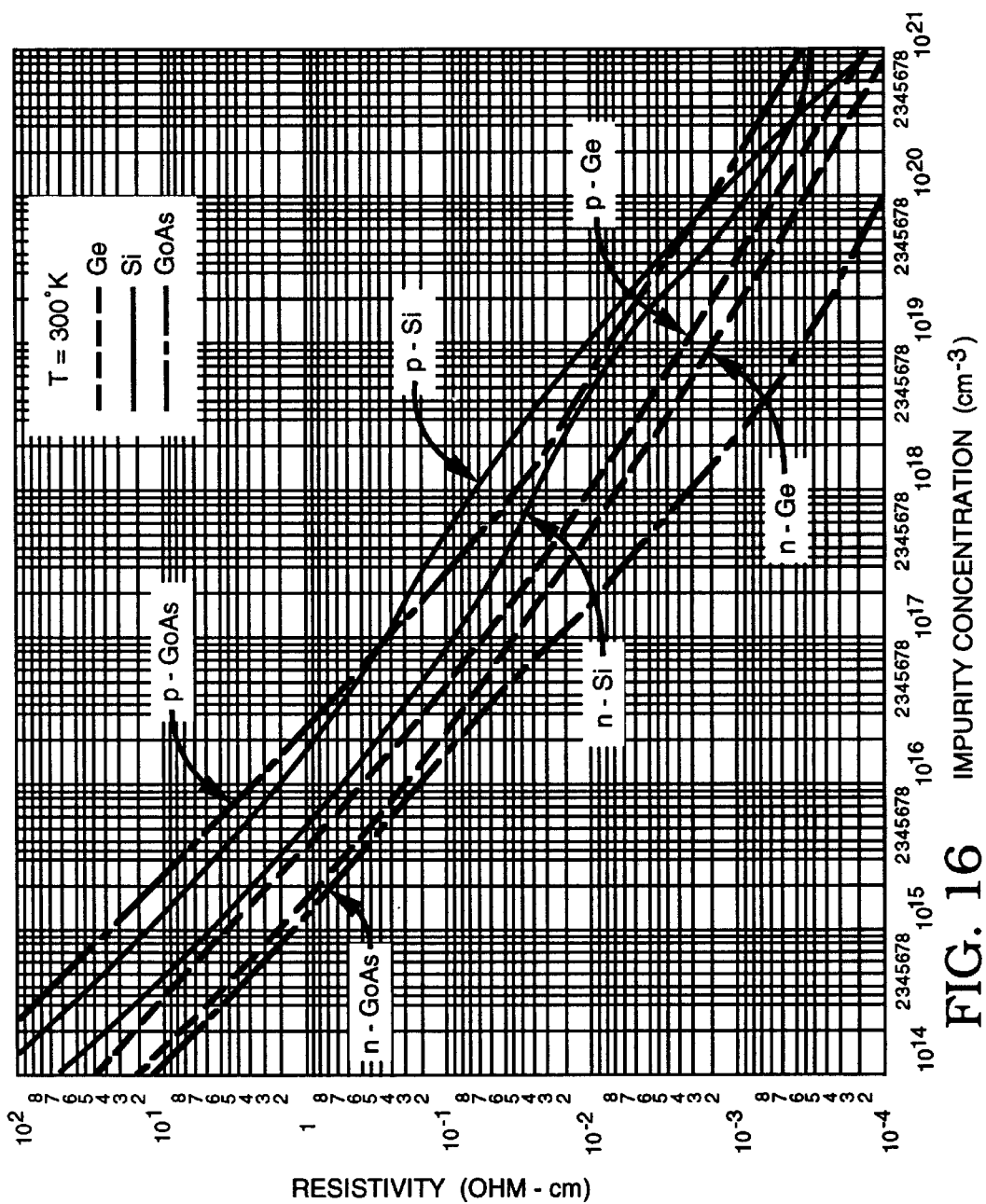
FIG. 16 shows a graph of the resistivity of various semiconductor materials as a function of impurity concentration.

FIG. 15 shows a graph of the mobility of silicon and germanium as a function of dopant concentration, for both N-type and P-type material. For example, at a concentration of $10^{17}$ $cm^{-3}$ N-type silicon has a mobility of about 700 $cm^2$/volt-sec and P-type silicon has a mobility of about 350 $cm^2$/volt-sec. In comparison, N-type germanium has a mobility of about 3,000 $cm^2$/volt-sec and P-type germanium has a mobility of about 900 $cm^2$/volt-sec. Moreover, this relationship between the mobility of silicon versus the mobility of germanium obtains at a variety of temperatures. As shown in FIG. 16, the mobility and other factors that go into determining resistivity also give germanium an advantage over silicon. For example, at a concentration of $10^{17}$ $cm^{-3}$ the resistivity of N-type silicon is approximately three times the resistivity of N-type germanium. So purely on the basis of mobility and resistivity, germanium is very attractive.

Furthermore, germanium has a higher thermal conductivity which means that the junction temperature remains lower for equivalent levels of power dissipation.

Nonetheless, germanium has a number of defects which argue strongly against its use in power transistors. First, the oxide of germanium is chemically reactive (e.g, it is relatively water soluble) and it is electrically leaky. Second, for germanium the critical electrical field (i.e., the maximum limit beyond which breakdown will occur) is about 8 V/$\mu$m as compared with 20–30 V/$\mu$m for silicon. The energy gap of germanium is only 0.66 eV versus 1.12 eV for silicon at 300° K. These factors have an adverse effect on the breakdown voltage and on leakage, especially at high temperatures. The lattice constant of germanium (5.64613 Å) is quite similar to that of silicon (5.43095 Å), as are the number of atoms per $cm^3$ (4.42×$10^{22}$ for germanium, 5.0×$10^{22}$ for silicon). Inside a given layer these differences are still enough that if one has a large change of concentration numerous crystallographic defects can occur. A change in germanium concentration of 10% over a short distance can lead to excessive defects. If these defects are located in the channel region or near a peak field region of the device, the problem can be serious. Finally, the intrinsic carrier concentration of germanium is about three orders of magnitude higher than that of silicon (2.4×$10^{13}$ $cm^{-3}$ versus 1.45×$10^{10}$ $cm^{-3}$), leading to excessive current leakage particularly at high temperatures.

The problems encountered with including pure germanium in the device can be overcome by including a Si-Ge layer, which contains a specified percentage of germanium atoms, typically from about 5% to about 40%.

Since rapid changes in the germanium content in a silicon-germanium layer can lead to high defect densities, the layer can be formed by controlling the size of the concentration steps or gradient (e.g., by breaking a concentration step into smaller steps) so that defect generation during fabrication is minimal. Under such circumstances it is reasonable to assume that mobility is not adversely affected and that a low defect Si-Ge layer will have a mobility and resistivity somewhere between that of silicon and germanium.

Figure 17:
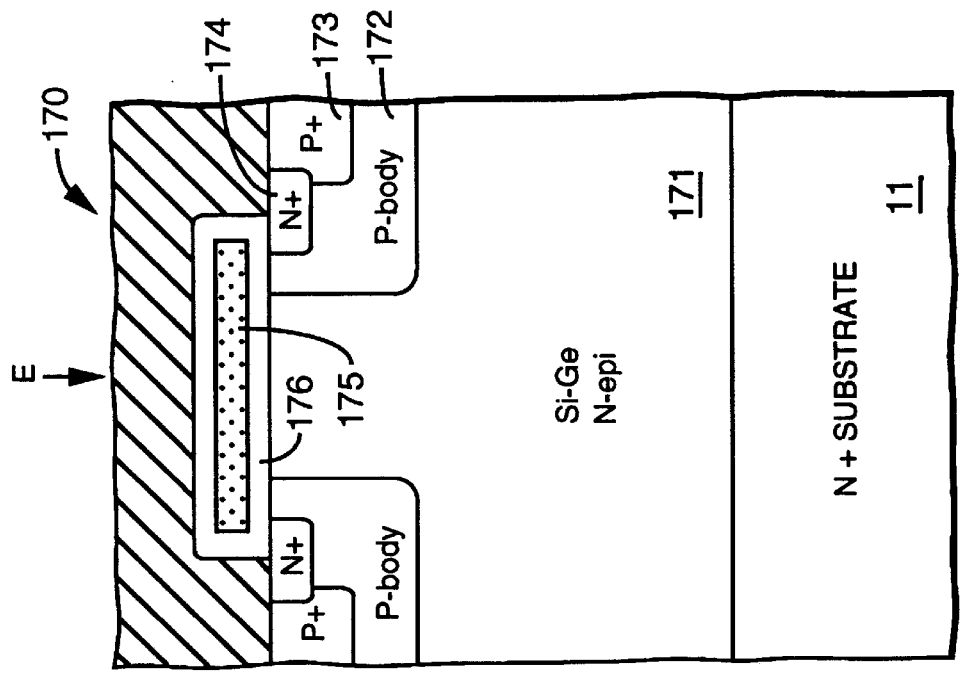
FIG. 17 shows a cross-sectional view of a planar DMOSFET which includes Si-Ge layer in accordance with this invention.

A first embodiment is shown in FIG. 17. MOSFET is a planar DMOSFET which includes a silicon N+ substrate 11 and a Si-Ge epitaxial (epi) layer 171 doped with N-type impurity and grown on top of the silicon substrate 11. Si-Ge layer 171 is typically 1 to 50 $\mu$m thick and typically includes from 5% to 30% or 40% (mole-fraction) germanium. Formed in the Si-Ge epi layer 171 are a P-body region 172, a P+ body contact region 173, and an N+ source region 174. Current flow from N+ source region 174 downward to the N+ substrate 11 (which functions as the drain) is controlled by a gate 175 which is separated from the channel region by a gate oxide layer 176. Because the N+ substrate 11 is pure silicon, one could find a lot of defects at the interface between N+ substrate 11 and Si-Ge epi layer 171. However, these defects are far away from the active regions of the device and are located in a region of relatively low electric field, and so long as the epi growth is done in a way that prevents the defects from propagating (e.g., by beginning the epi growth slowly and then increasing the rate of growth) the defects would be clustered around the substrate-epi interface but would not extend into the rest of the Si-Ge epi layer 171. Moreover, if the defects occupy the interface between the N+ substrate and the epi layer, then the updiffusing substrate dopants more than compensate for the region of the defects. One method of capturing and holding the defects in a specific region of high germanium content, especially for doses exceeding 1×$10^{15}$ $cm^{-2}$, is to precipitate oxygen onto the defects to create a permanent high-energy chemical bond through epitaxial or implantation means. The substrate oxygen, initially in solution at $10^{15}$ to $10^{16}$ $cm^{-3}$, is precipitated using a 500° C. to 800° C. oxidation. This oxygen in solution must come to equilibrium, especially if the furnace cycle is of limited temperature, for 8 to 15 hours. The oxygen will then cluster on the germanium defects and create semipermanent getter sites as long as the subsequent termperature cycles remain largely below 900° C.

Because of the increased mobility of Si-Ge epi layer 171 MOSFET 170 has a significantly lower on-resistance than it would have if it were fabricated from pure silicon without an undue adverse effect on the breakdown voltage of the device.

Si-Ge epi layer 171 extends to an interface with the gate oxide layer 176. As a result, germanium may become incorporated into the gate oxide layer 176 in this embodiment, with the unfavorable effects on the reliability of the gate oxide layer discussed above. This problem could be overcome by keeping the germanium away from the gate oxide layer by forming a very thin layer of silicon on the surface. However, in some cases this may be difficult to accomplish.

Figure 18:
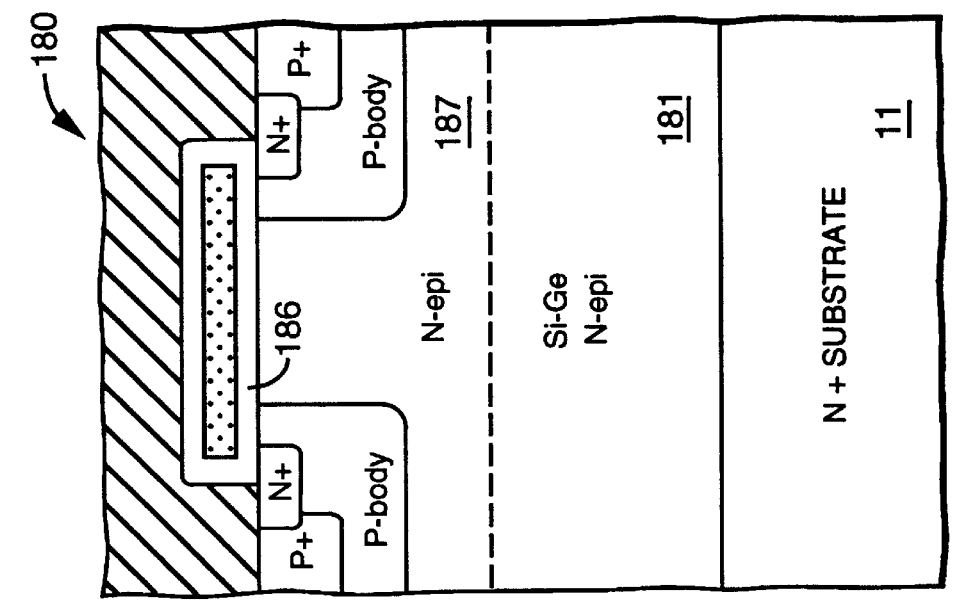
FIG. 18 shows a cross-sectional view of a planar MOSFET similar to the MOSFET of FIG. 17 with an N-type silicon epi layer on top of the Si-Ge layer.

MOSFET 180 shown in FIG. 18 is similar to MOSFET 170 but an N-type silicon epi layer 187 is grown on top of Si-Ge epi layer 181. This prevents any migration of germanium atoms into the gate oxide layer 186. Silicon epi layer 187 is typically from 0.1 $\mu$m to 1–2 $\mu$m thick but could be as thick as 5 $\mu$m. The interface between Si-Ge epi layer 181 and silicon epi layer 187 would be formed by turning off the germanium source during the epi growth process. Nonetheless, at this interface there would be some crystallographic defects. Preferably, this interface is kept as far away from the PN body-to-drain junction as possible.

Figure 20:
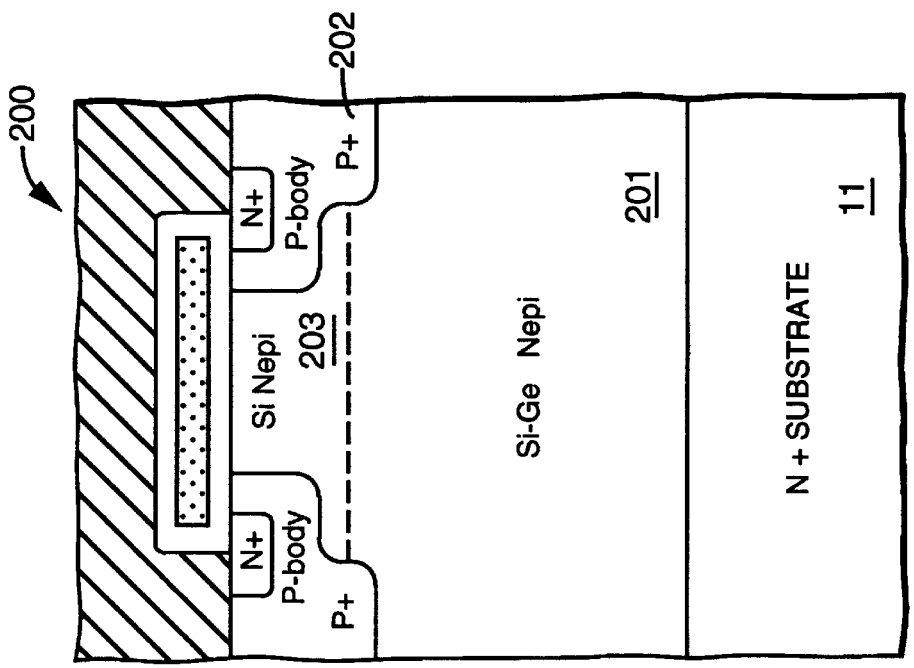
FIG. 20 shows a cross-sectional view of a MOSFET similar to the MOSFET of FIG. 19 wherein the deep P+ diffusion extends into the Si-Ge layer.
Figure 19:
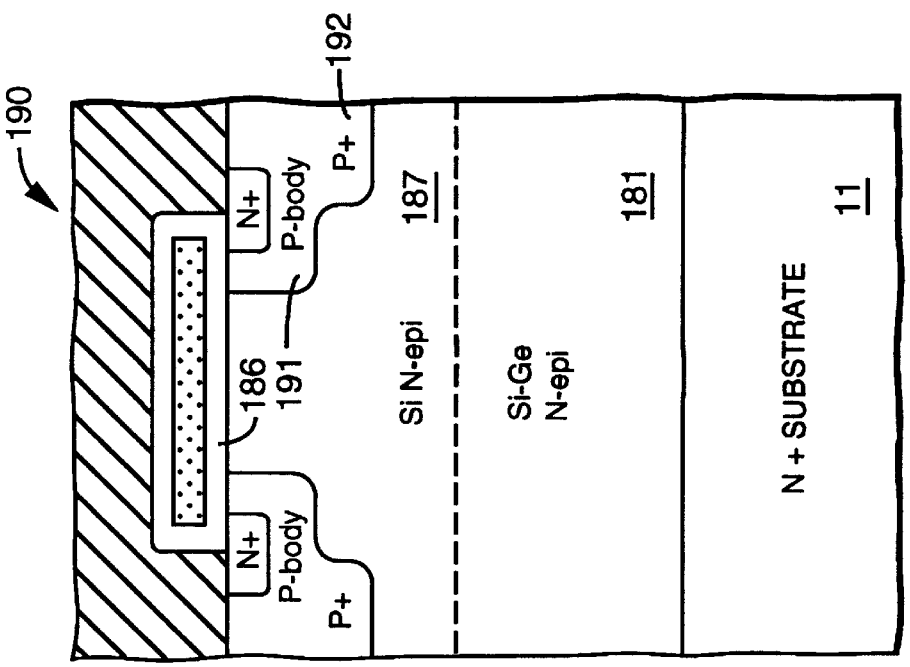
FIG. 19 shows a cross-sectional view of a MOSFET similar to the MOSFET of FIG. 18 with a deep P+ diffusion extending below the P-body region to assure that voltage breakdown will not occur near the gate oxide layer.

MOSFET 190 shown in FIG. 19 is similar to MOSFET 180, but a deep P+ diffusion 192 extends below the P-body region 191 to assure that voltage breakdown will not occur near the gate oxide layer and to suppress any significant NPN bipolar conduction. In MOSFET 200 shown in FIG. 20 the deep P+ diffusion 202 extends into the Si-Ge epi layer 201. While MOSFET 200 would have a lower breakdown voltage, the breakdown would be forced to occur away from the surface. On the other hand, running the PN body junction across the interface between Si-Ge epi layer 201 and Si epi layer 203 may increase the amount of current leakage in the device, particularly if the dopant concentrations in Si-Ge epi layer 201 and Si epi layer 203 are flat (i.e., independent of depth).

FIGS. 21A–21I illustrate a variety of doping profiles that could be used in MOSFETs 170, 180, 190 and 200 shown in FIGS. 17–20, respectively. In all cases (except for FIG. 21F) the doping profile is taken at a vertical section of the MOSFET that does not transect either the body or source regions, illustrated by cross-section EE' in FIG. 17. The solid line represents the concentration of N-type (donor) atoms and the dashed line represents the concentration of germanium atoms.

Figure 21A:
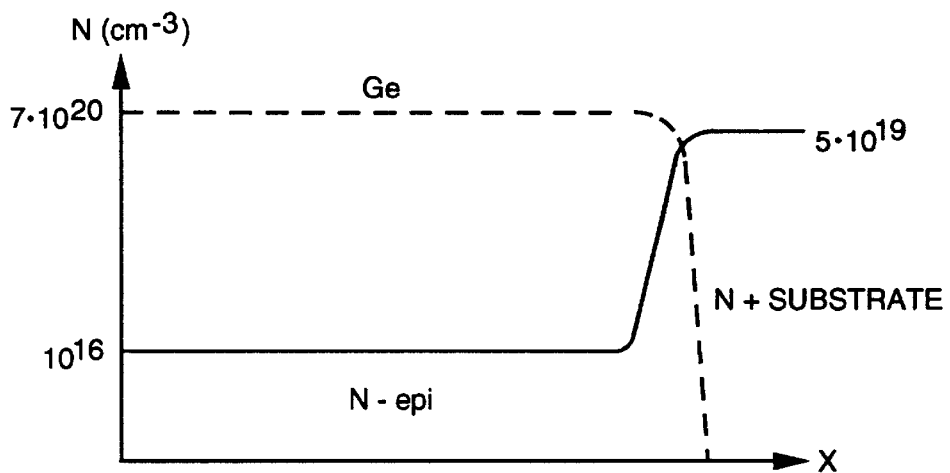
FIGS. 21A–21I illustrate a variety of doping profiles that could be used in the MOSFETs shown in FIGS. 17–20, respectively.
Figure 21B:
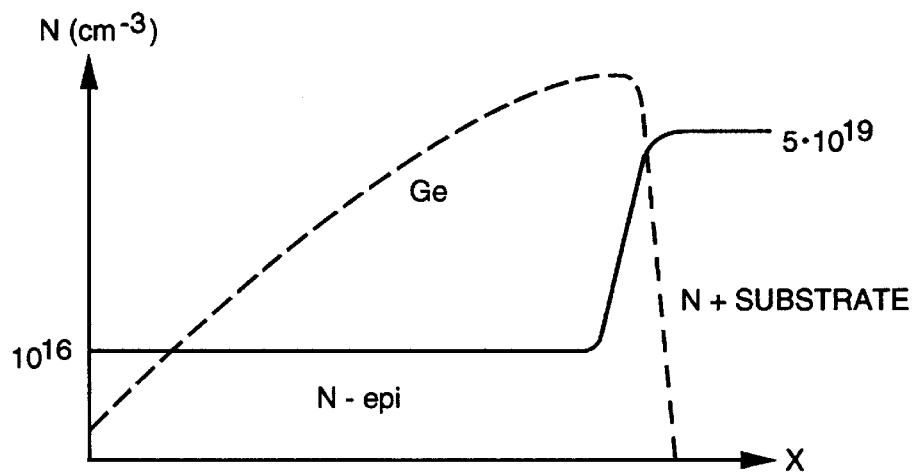
Figure 21C:
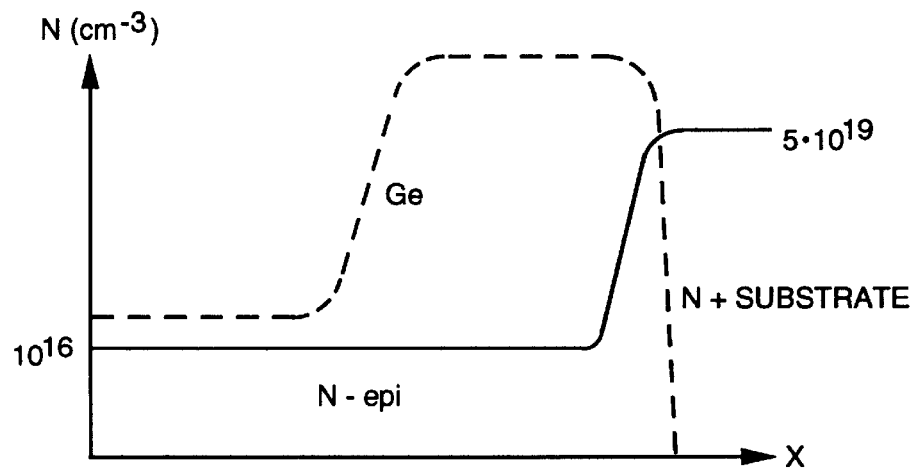

FIGS. 21A–21C relate to MOSFET 17, in which the Si-Ge layer 171 extends all the way to the surface of the semiconductor material. N+ substrate 11 is doped to $5\times10^{19}$ cm$^{-3}$ with N-type impurity and Si-Ge epi layer 171 is doped to $1\times10^{16}$ cm$^{-3}$ with N-type impurity, although the latter could be doped as heavily as $10^{17}$ cm$^{-3}$ or as lightly as $10^{14}$ cm$^{-3}$, the actual level depending on the desired breakdown voltage. The germanium content in the N+ substrate 11 is very low but rises to $7\times10^{20}$ cm$^{-3}$ in epi layer 171, which is equivalent to about 14% germanium. The percentage of germanium in epi layer 171 could be as high as about 40% or as low as about 5%.

Figure 3:
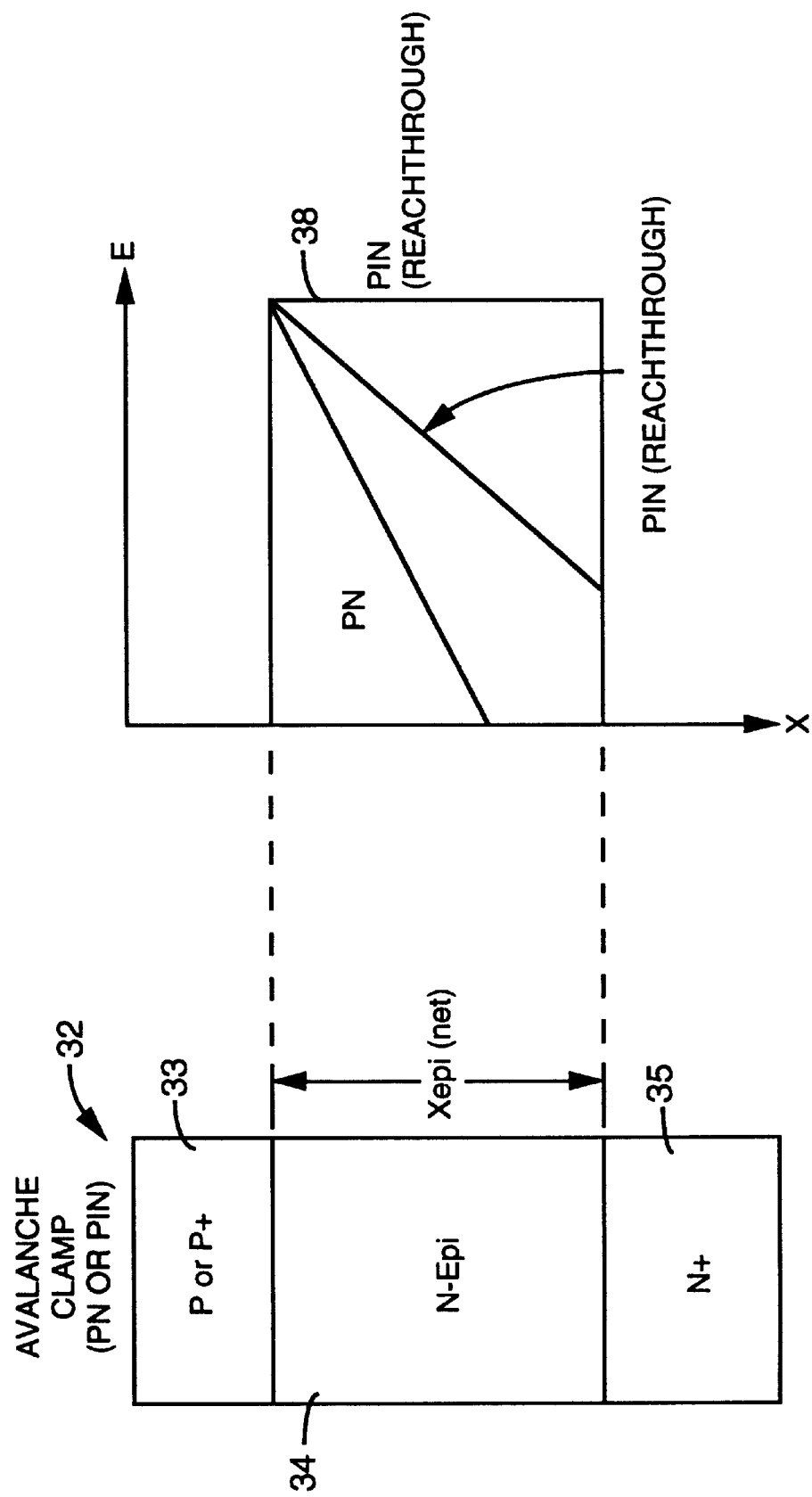
FIG. 3 shows a cross-sectional view of a conventional PN or PIN avalanche clamping diode as well as a graph of the strength of the electric field in the diode.

FIG. 21B shows the same N-type impurity levels, but the concentration of germanium atoms falls gradually as one approaches the semiconductor surface. The advantage of this structure is that, as shown in FIG. 3, the electric field is highest near the surface, where the germanium content is low and where the breakdown voltage is therefore closer to that of silicon. This particularly true for the PN and PvN junctions. As one moves deeper into the silicon, the germanium content becomes greater, taking advantage of a lower resistance where the electric field is weaker and where the breakdown voltage can therefore be lower. In FIG. 24C the germanium concentration increases in a stepwise fashion rather than gradually as one moves into the silicon.

Figure 21D:
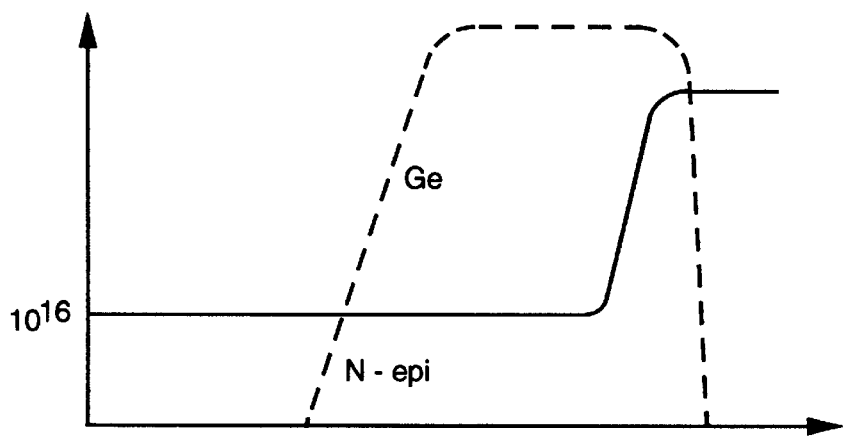
Figure 21E:
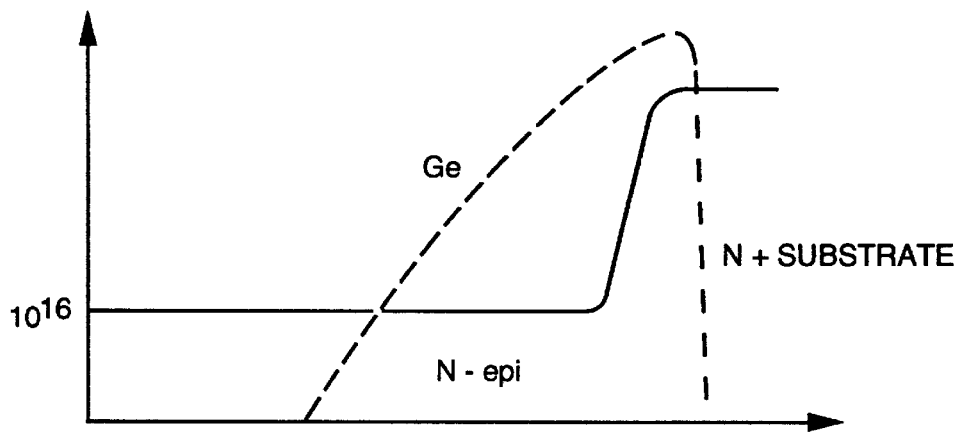
Figure 21F:
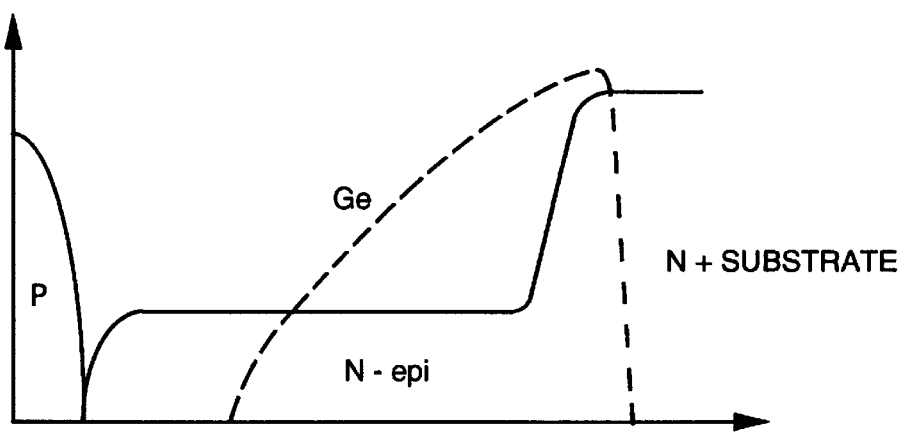

FIGS. 21D–21I relate to MOSFETs 180, 190 and 200, where the Si-Ge layer does not extend to the semiconductor surface. In FIGS. 21D and 21E the N-type doping is similar to the profiles shown in FIGS. 21A–21C. In FIG. 21D the germanium content decreases quite abruptly whereas in FIG. 21E the germanium content decreases gradually, in both cases to zero. FIG. 21F the germanium content is similar to that shown in FIG. 21E, but a P-type region is formed near the surface. The P-type region could be, for example, a body region or the anode of a clamping diode. The germanium atoms are kept away from the PN junction.

Figure 21G:
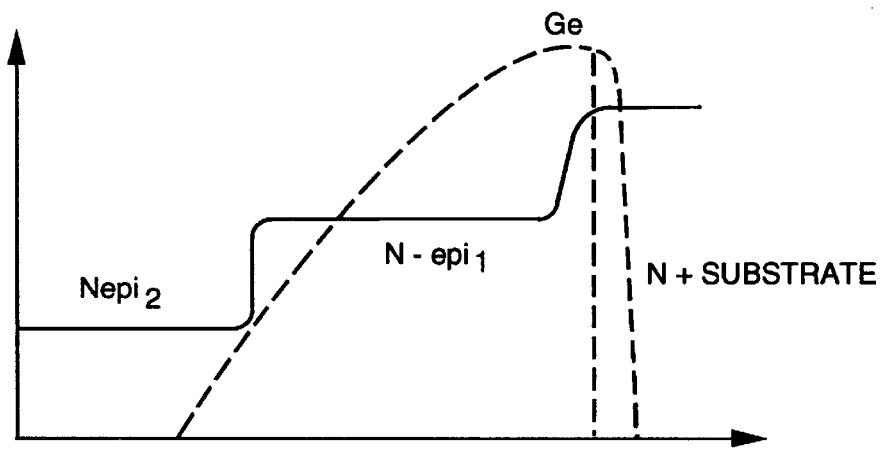
Figure 21H:
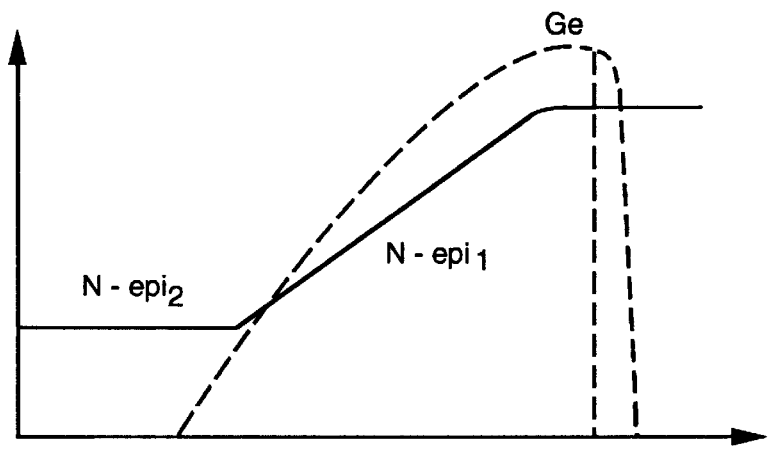
Figure 21I:
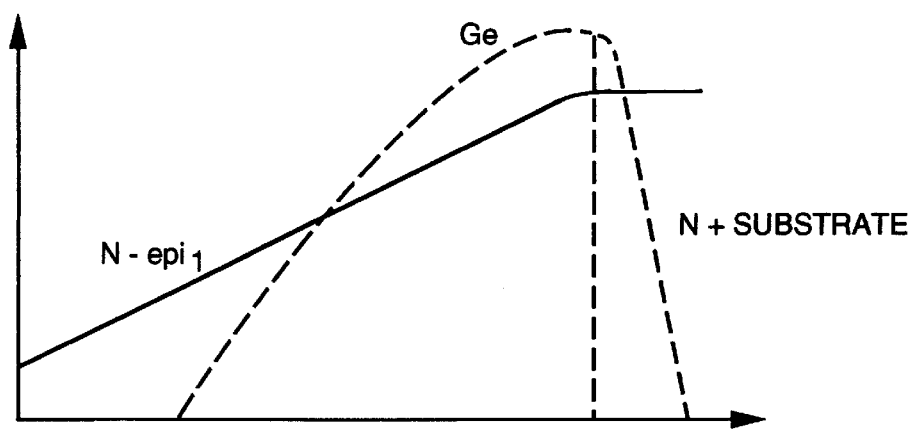

In FIGS. 21G–21I the germanium content is graded in the manner of FIGS. 21E and 21F, but the N-type impurity is varied. In FIG. 21G the N-type impurity is stepped downward, forming epi layers N-epi$_1$ and N-epi$_2$. In FIG. 21H the N-type impurity is gradually reduced to a constant level in layer N-epi$_2$. In FIG. 21I the N-type impurity is gradually reduced throughout the Si-Ge layer. In each case the N-type impurity might be at a concentration of more than $10^{17}$ cm$^{-3}$ in the N+ substrate 11 and fall to $10^{15}$ or $10^{16}$ cm$^{-3}$ at the semiconductor surface. Alternatively, for a very high-voltage (e.g., 500 V) device the N-type dopant concentration might fall from the high $10^{14}$s cm$^{-3}$ in N+ substrate 11 to the low $10^{14}$s cm$^{-3}$ or into the $10^{13}$ cm$^{-3}$ range at the semiconductor surface.

Also, the germanium profile shown in any one of FIGS. 21A–21D could be substituted for that shown in FIGS. 21G–21I. One advantage of varying the germanium concentration in small increments or continuously in the process of growing the epi layer is that the stress from the addition of the germanium can be relieved gradually. In any event, subsequent thermal diffusion will tend to smooth out any small steps in the germanium profile. On the other hand, a rather sharp step increase deep in the epi layer, away from the active regions of the device, would be acceptable so long as the crystallographic defects do not propagate extensively into the overlying material. In this case the defects would be concentrated in the vicinity of the step increase and should not materially affect the active regions of the device. The N+ substrate itself has a high defect count because of its degenerate doping concentration.

In fabricating MOSFETs 170, 180, 190 and 200, the Si-Ge epi layer can be grown by including a source of germanium gas in the epi reactor.

Figure 22B:
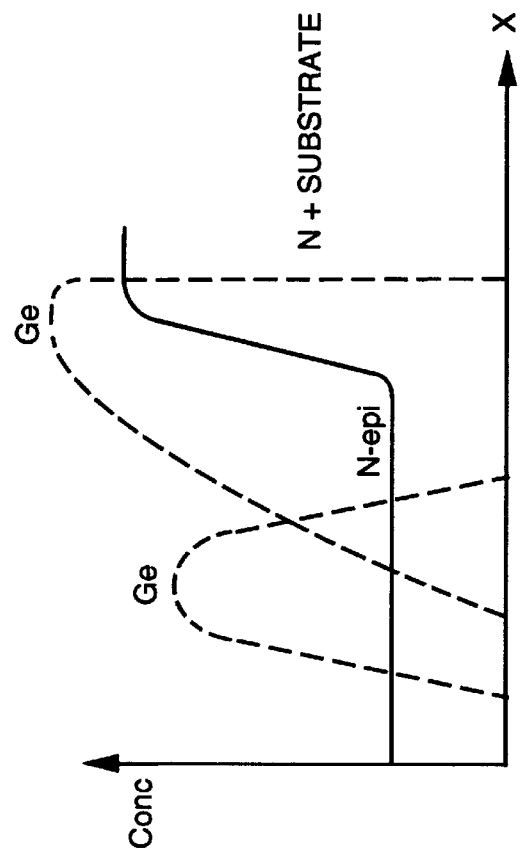
FIG. 22B shows a graph of the profiles of the germanium and N-type dopant in the MOSFET shown in FIG. 22A.
Figure 22A:
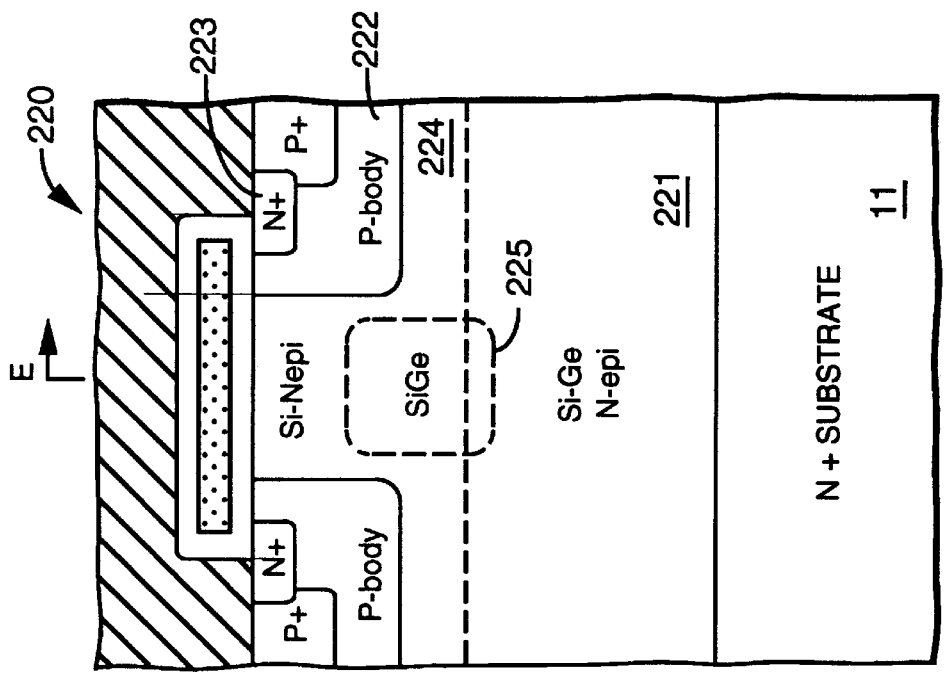
FIG. 22A shows a planar DMOSFET which includes a Si-Ge layer.

FIG. 22A shows a planar DMOSFET 220 which includes a Si-Ge epi layer 221 and a silicon epi layer 224. MOSFET 220 includes a P-body region 222 and an N+ source region 223. A submerged Si-Ge region 225 is formed in the center of the MOSFET directly underneath the gate by implanting germanium, either before or after the gate is formed. Preferably the Si-Ge region 225 is implanted after the P-body diffusion to prevent it from being diffused. FIG. 22B shows profiles of the germanium and N-type dopant in MOSFET 220 at the cross-section EE' in FIG. 22A. Si-Ge region 225 reduces the resistance to the current flowing downward in MOSFET 220 beyond the reduction that is achieved from Si-Ge epi layer 221. The implant dose and energy may make this implementation difficult with present day equipment. The SiGe region 225 also helps to spread the drain current more evenly through the epi layer thereby improving the on-resistance.

FIGS. 23–30 illustrate the application of the principles of this invention to a trench-gated MOSFET (trenchFET).

Figure 23:
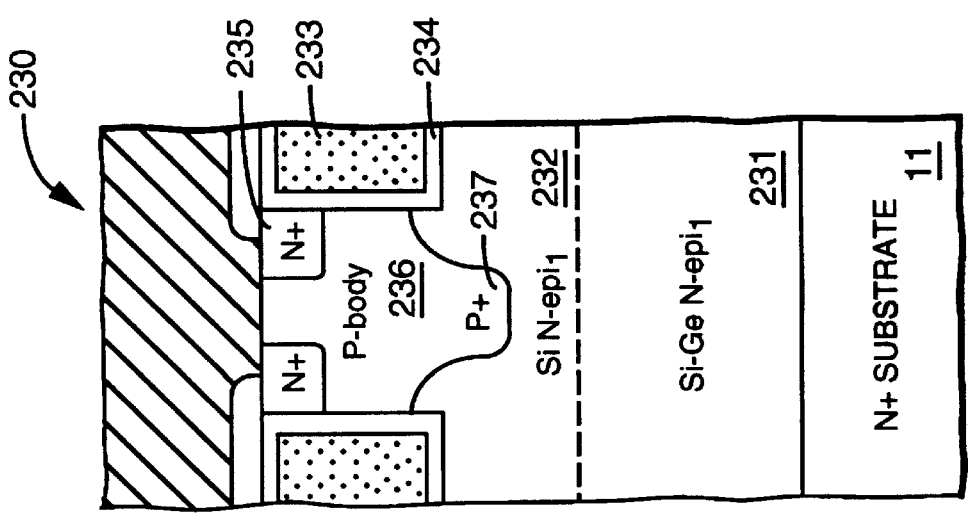
FIG. 23 shows a cross-sectional view of a trenchFET which includes a Si-Ge layer.

In trenchFET 230 shown in FIG. 23 a Si-Ge N-epi layer 231 is grown on N+ substrate 11. The active area of the trenchFET are formed in a silicon N-epi layer 232 which is grown on top of Si-Ge N-epi layer 231. The active area includes a gate 233 which is formed in a trench and separated from N-epi layer 232 by a gate oxide layer 234. TrenchFET 230 also includes a P-body region 236 and an N+ source region 235. A deep P+ diffusion at the center of the trenchFET cell assures that breakdown will occur away from the gate oxide layer in the manner taught in the above-referenced U.S. Pat. No. 5,072,266, except that the field concentration leading to avalanche is more prevalent with the defects and narrower bandgap of the silicon-germanium layer.

Figure 24:
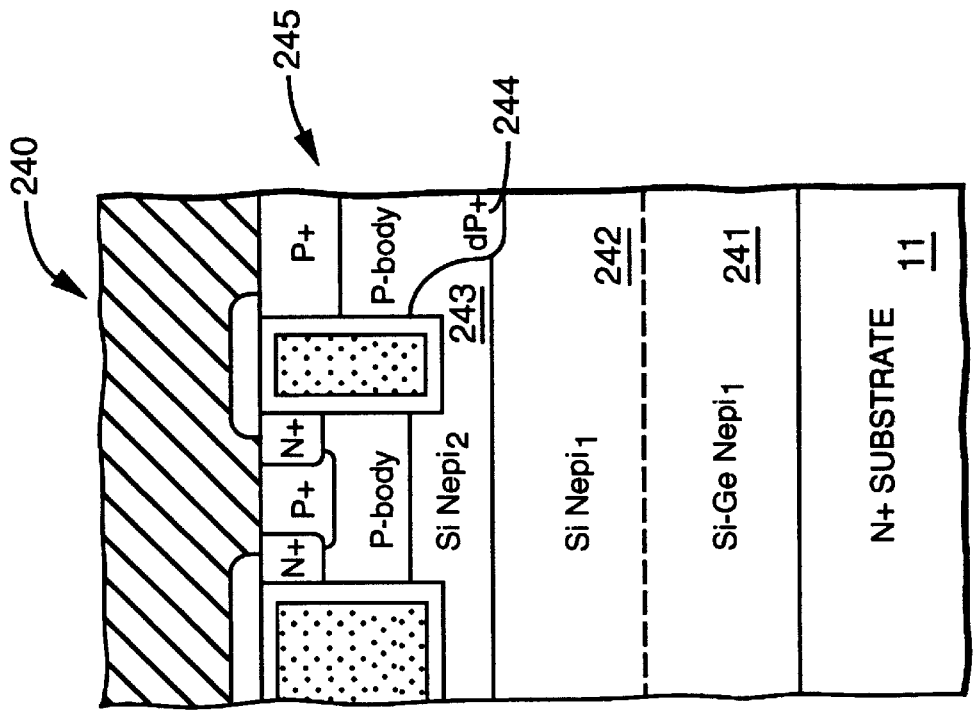
FIG. 24 shows a cross-sectional view of a trenchFET which includes a Si-Ge layer and a silicon epi layer which is divided into two sublayers.

TrenchFET 240 shown in FIG. 24 includes a Si-Ge epi layer 241 and a silicon epi layer which is divided into two sublayers 242 and 243. Sublayer 243 is doped with N-type dopant to a higher concentration than sublayer 242. In trenchFET 240 there is no deep P+ diffusion similar to diffusion 237 in the center of the trenchFET cell. Instead, a deep P+ diffusion 244 is formed in a separate diode cell 245 which is located on the opposite side of the gate from the trenchFET cell. Deep P+ diffusion 244 extends into silicon epi layer 242. The PN junction between deep P+ diffusion 244 and silicon epi layer 242 forms a clamping diode which breaks down before any PN junction in the trenchFET cell, in the manner taught in application Ser. No. 08/495,555, except that the presence of the narrow bandgap silicon-germanium layer exacerbates the effect.

Figure 25:
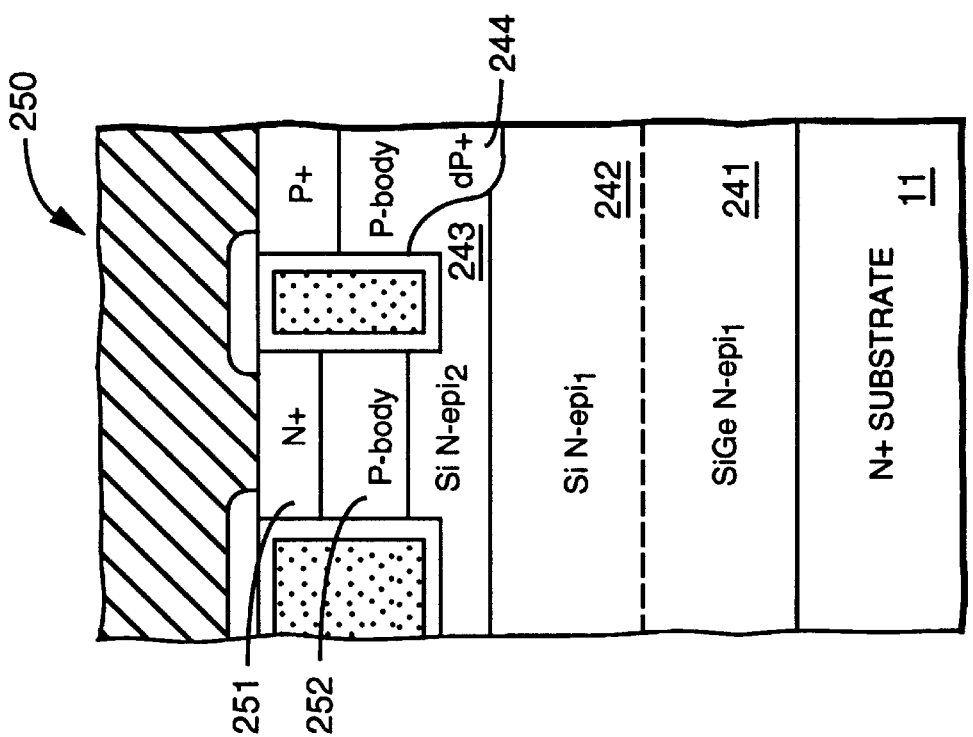
FIG. 25 shows a cross-sectional view of a trenchFET which is similar to the trenchFET shown in FIG. 24, except that the N+ source region extends across the entire mesa between the trenched gates

TrenchFET 250 shown in FIG. 25 is similar to trenchFET 240 except that the N+ source region 251 extends across the entire mesa between the trenched gates. P-body region 252 can either be fully depleted in the manner taught in application Ser. No. 08/651,232, or P-body region 252 can be contacted at some location away from the cross-section shown in FIG. 25, as taught in application Ser. No. 08/460, 336, now abandoned in favor of 08/884,826 filed on Jun. 30, 1997 and issued as U.S. Pat. No. 5,877,538 on Mar. 2, 1999.

Figure 26:
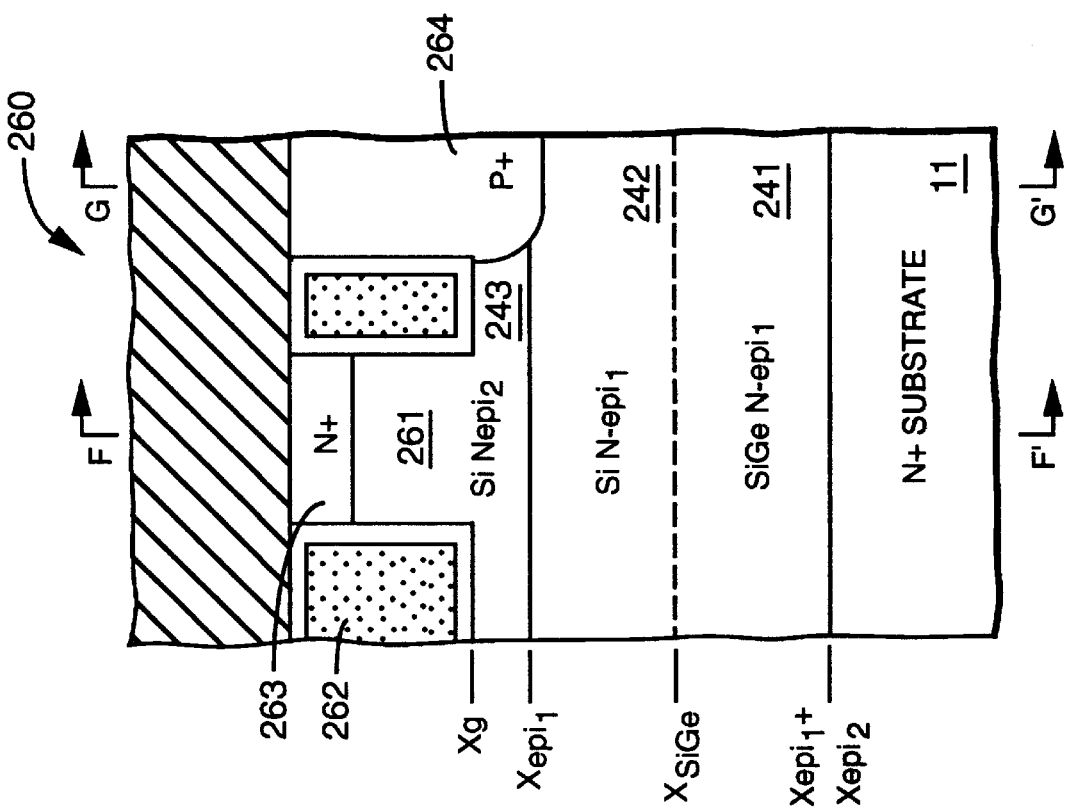
FIG. 26 shows a cross-sectional view of an ACCUFET which contains a Si-Ge epi layer.

FIG. 26 shows an ACCUFET 260 similar to the one taught in application Ser. No. 08/459,559, now U.S. Pat. No. 5,661,322 issued on Aug. 26, 1997, which contains no P-body region for forming a MOSFET channel. N+ substrate 11, Si-Ge epi layer 241 and silicon epi layers 242 and 243 are similar to the corresponding layers in trenchFET 250. The mesa 261 between gates 262 is made narrow enough and gates 262 are doped such that current flow from the "source" 263 is pinched off when no bias is applied to gates 262. The PN junction between deep P+ diffusion 264 and silicon N-epi layer 242 forms a clamping diode which is reverse-biased when ACCUFET 260 is operating with the N+ substrate 11 (drain) biased positive with respect to the N+ source 263. This diode is designed to break down at a predetermined voltage and thereby prevent breakdown from occurring elsewhere in the ACCUFET 260.

Figure 27:
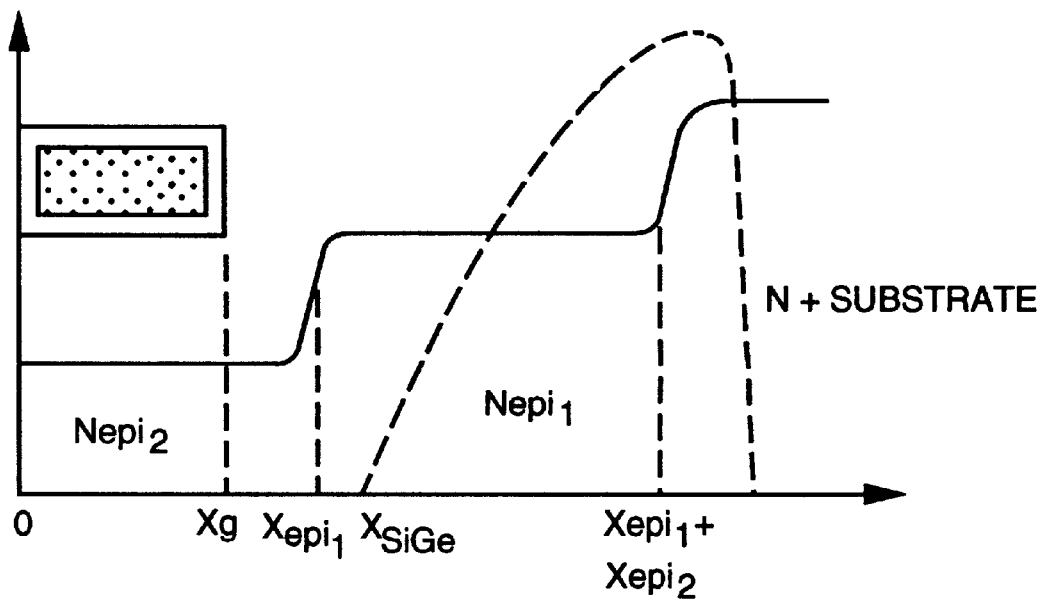
FIGS. 27 and 28 show dopant profiles taken at two cross-sections of the ACCUFET shown in FIG. 26.
Figure 28:
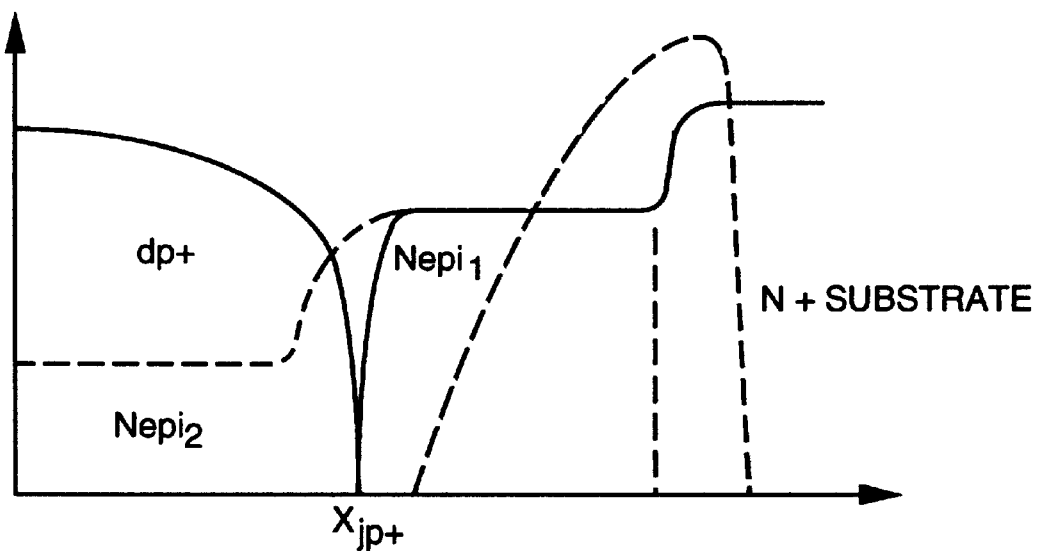

In each of trenchFETs 230, 240 and 250 and ACCUFET 260 the Si-Ge layer is kept below the trench to prevent the germanium from getting into the gate oxide layer. FIGS. 27 and 28 show dopant profiles taken at cross-sections FF' and GG', respectively, in FIG. 26. As shown in FIG. 27, N-epi layer 243 (Nepi$_1$) is doped more lightly with N-type dopant than is N-epi layer 242 (Nepi$_2$). As shown in FIG. 28, the deep P+ diffusion 264 extends entirely through Nepi$_2$ and into Nepi$_1$. Whether P+ diffusion extends to the Si-Ge epi layer 241 is not particularly important, since the purpose is to lower the breakdown voltage.

Figure 29:
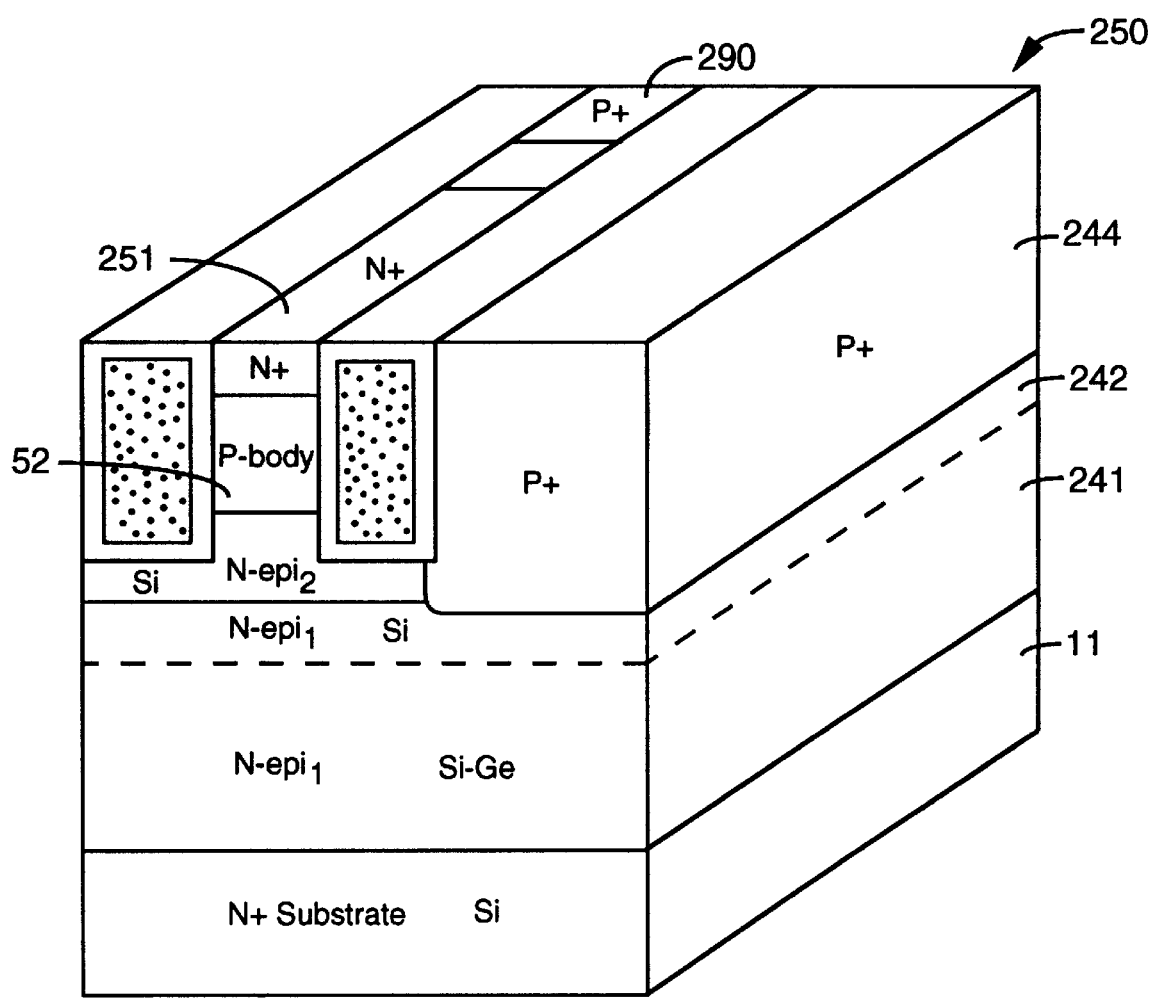
FIG. 29 shows a three-dimensional cross-section of the trenchFET shown in FIG. 25, illustrating how the P-body region may be contacted in a location away from the active areas of the device.

FIG. 29 shows a three-dimensional cross-section of trenchFET 250 (FIG. 25), illustrating how the P-body region 252 may be contacted via a P+ contact region 290 in a location away from the active areas of the device.

Figure 30B:
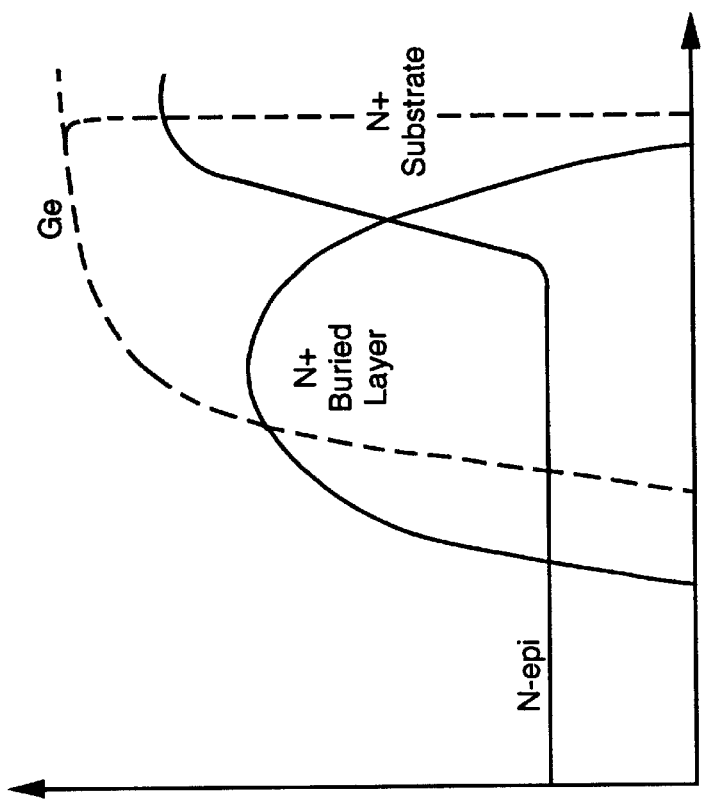
FIG. 30B is a graph showing the dopant profiles of N+ buried layer, the N-epi layer, and N+ substrate and the Si-Ge layer in the trenchFET shown in FIG. 30A.
Figure 30A:
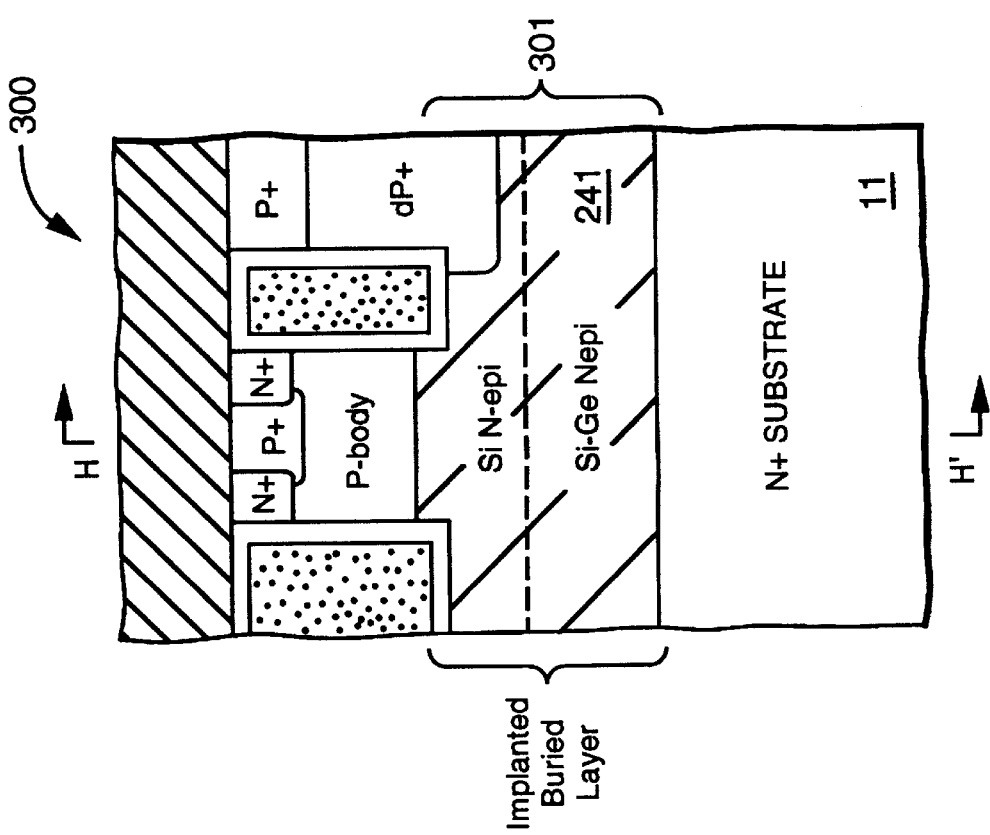
FIG. 30A shows a cross-sectional view of a trenchFET which contains a Si-Ge layer and an N+ buried layer.

Sometimes it is desired to extend the gate trench into the heavily doped N+ substrate. This can be difficult because of variations in the thickness of the epi layer. FIG. 30A shows a technique for solving this problem in a trenchFET 300 which entails implanting an N+ buried layer 301. N+ buried layer 301 diffuses upward to the bottom of the trenches and downward to merge with the N+ substrate 11. The location of the Si-Ge epi layer 241 is not affected by the N+ buried layer 301 and remains away from the bottom of the trench. FIG. 30B is a graph showing the dopant profiles of N+ buried layer 301, the N-epi layer, and N+ substrate 11 (solid lines) and the Si-Ge layer 241 (dashed lines) at cross-section HH'. The overlying P-type layers are excluded from the dopant profile.

Figure 4:
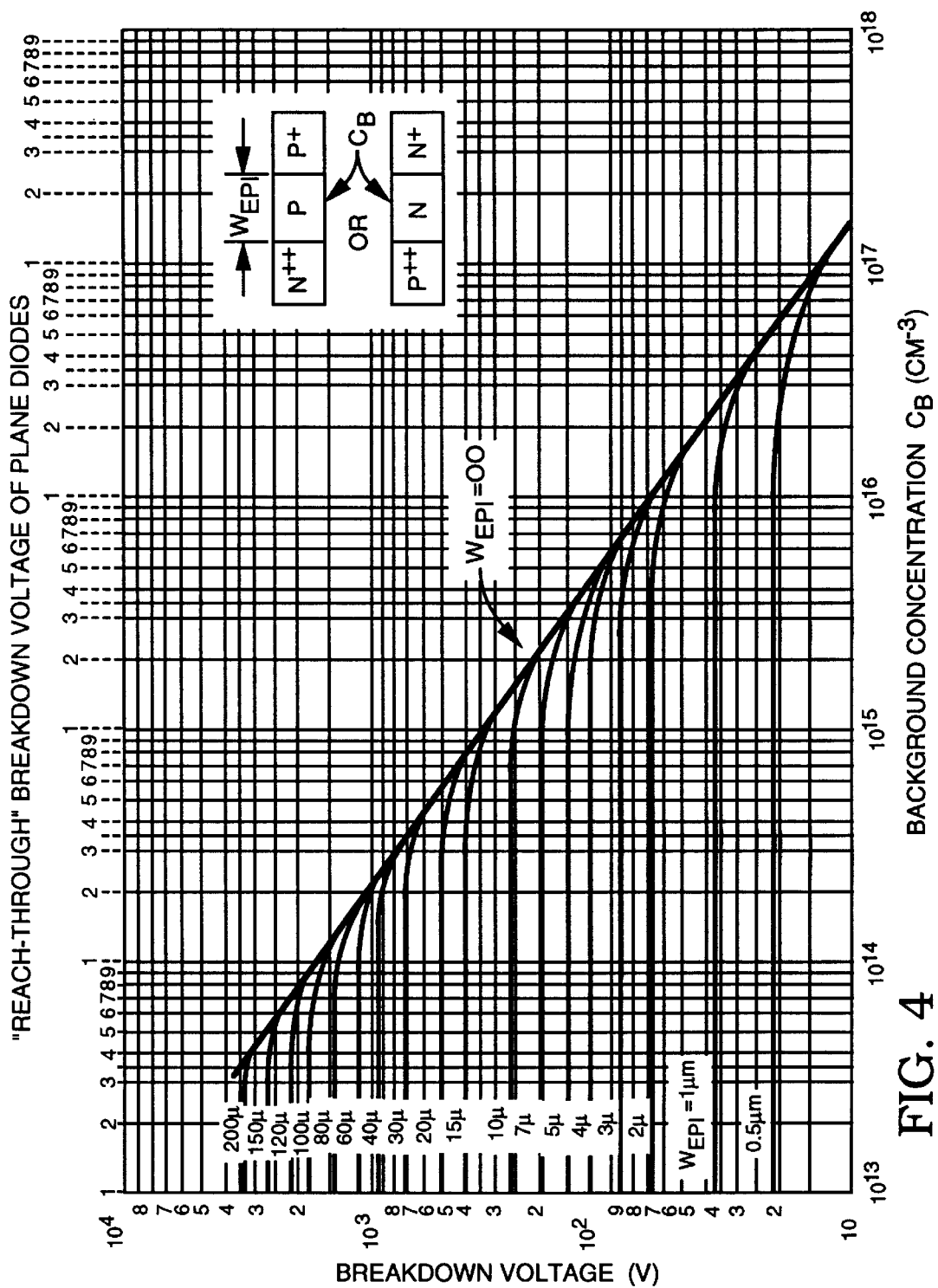
FIG. 4 illustrates a graph showing the reach-through breakdown voltage of a PIN diode as a function of the background doping concentration of the intermediate layer for various intermediate layer thicknesses.
Figure 6:
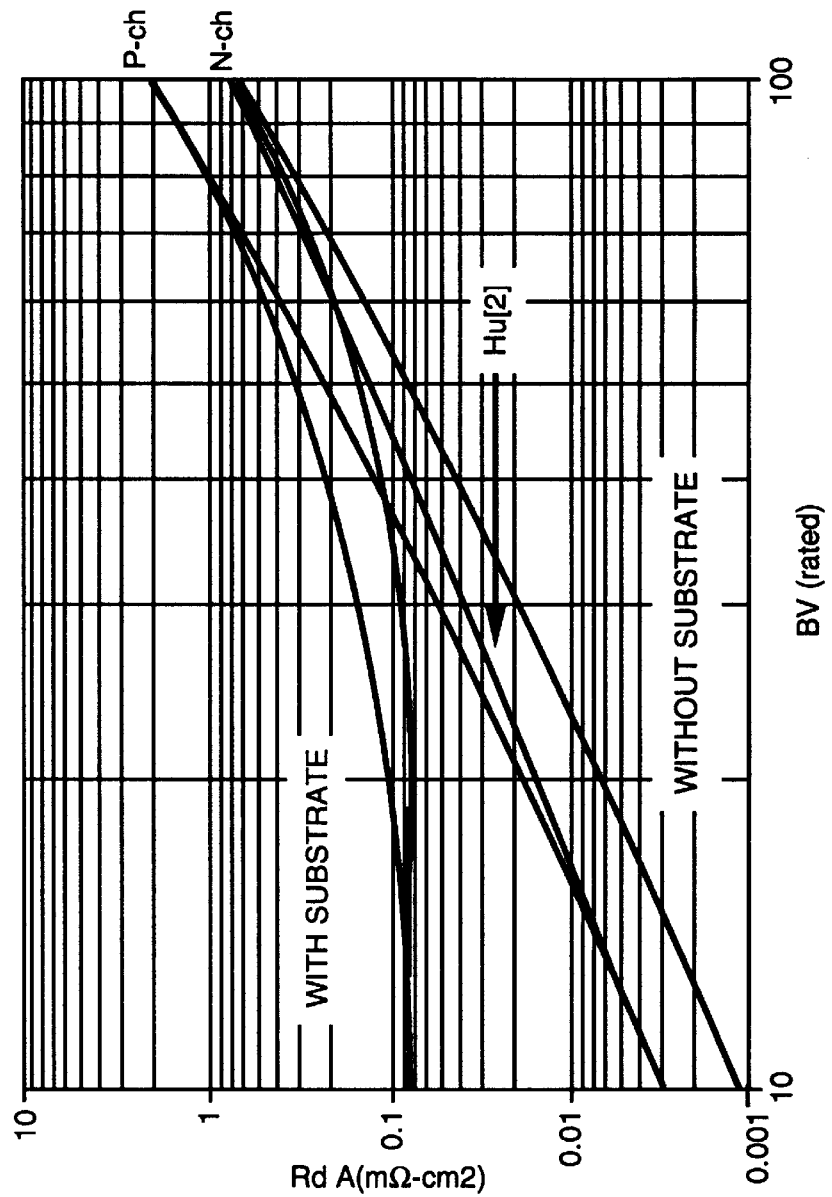
FIG. 6 is a graph which plots normalized on-resistance as a function of breakdown voltage for N-channel and P-channel devices.
Figure 5:
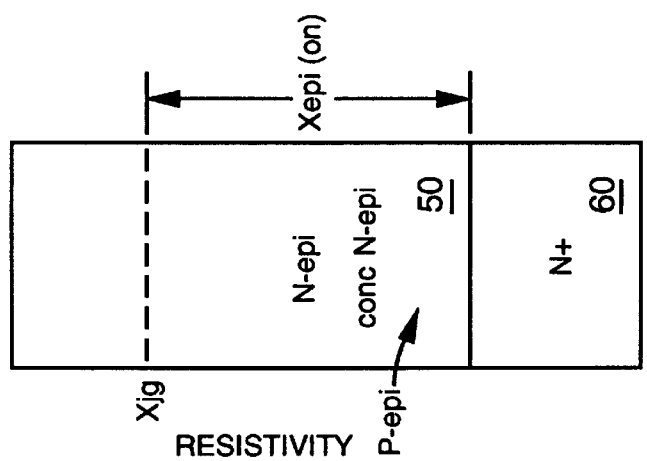
FIG. 5 is a cross-sectional view showing a portion of an N-epi layer and an N+ substrate.
Figure 8:
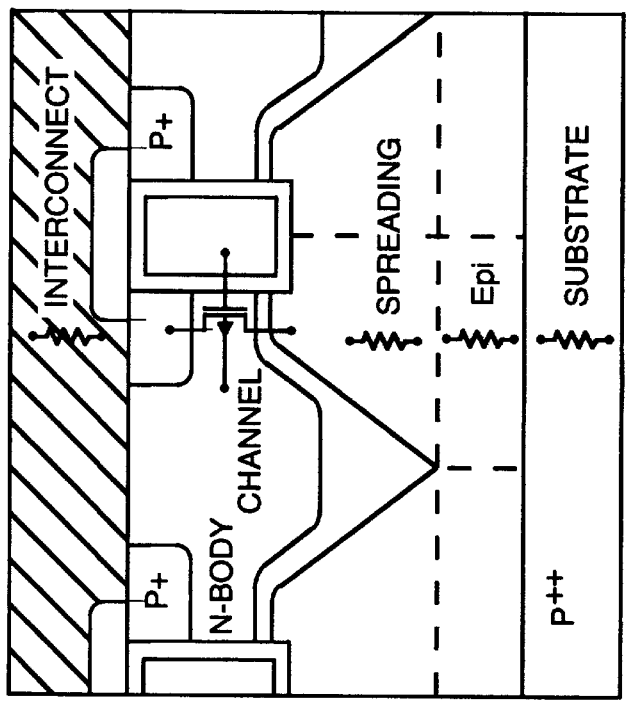
FIG. 8 shows pictorially the components of the total drain-to-source resistance in a trench-gated MOSFET.
Figure 7:
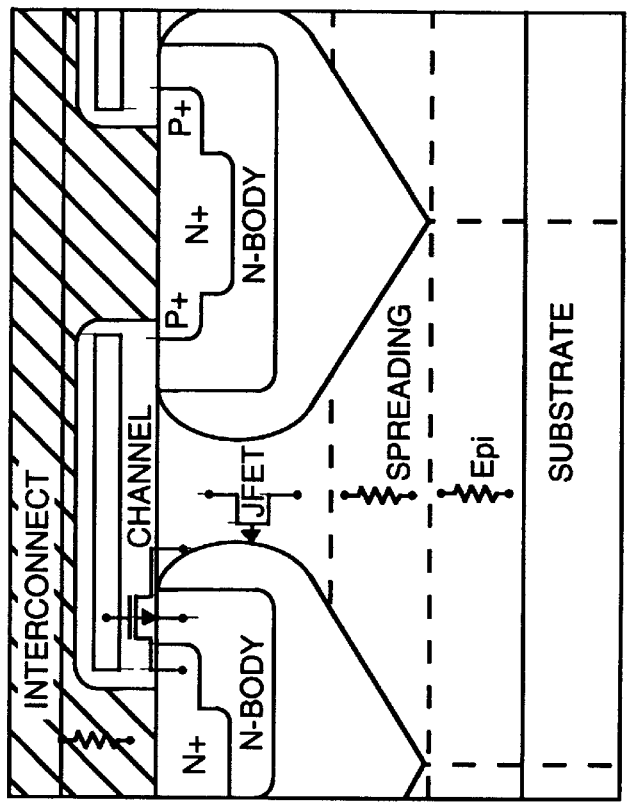
FIG. 7 shows pictorially the components of the total drain-to-source resistance in a planar DMOSFET.
Figure 9B:
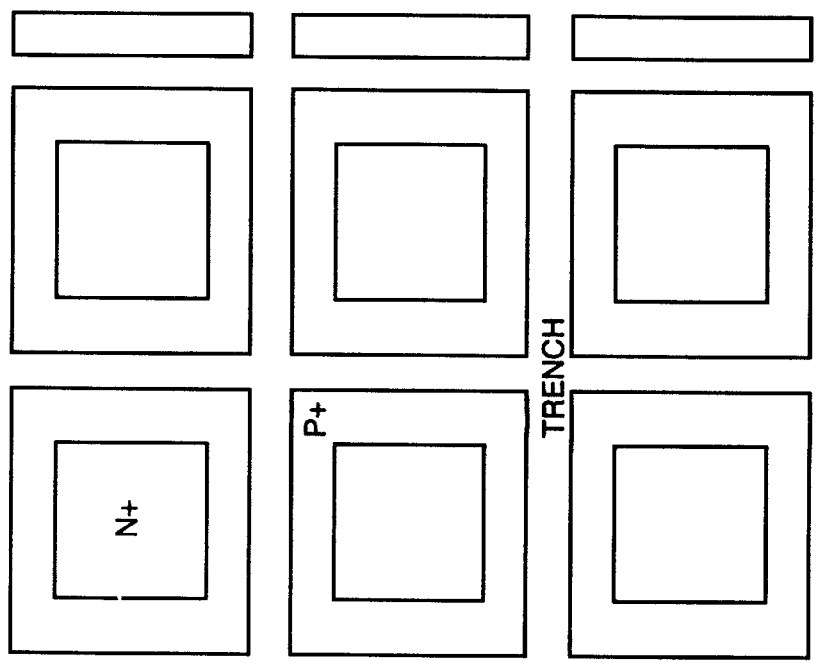
FIGS. 9A and 9B illustrate cross-sectional and plan views, respectively, of a MOSFET which contains a central deep diffusion as taught in U.S. Pat. No. 5,072,266.
Figure 9A:
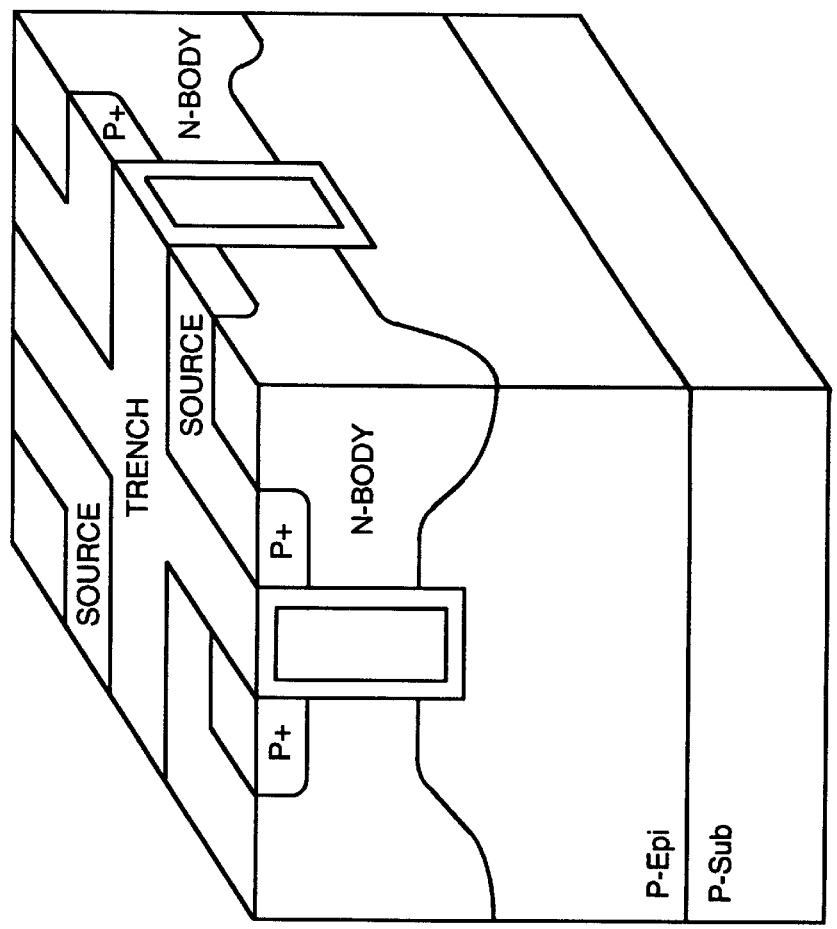
Figure 10C:
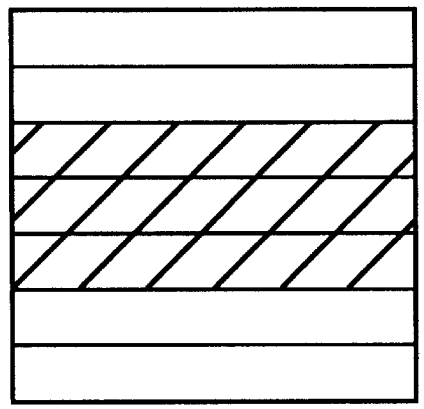
FIGS. 10A, 10B and 10C illustrate plan views of a trenchFET containing square, hexagonal and striped cells, respectively.
Figure 10B:
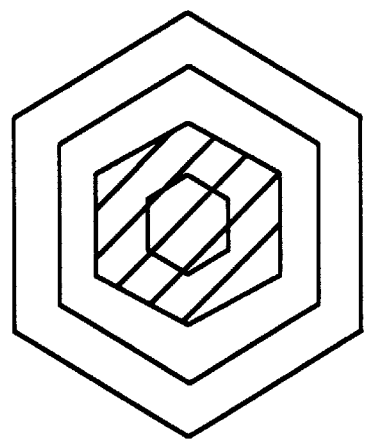
Figure 10A:
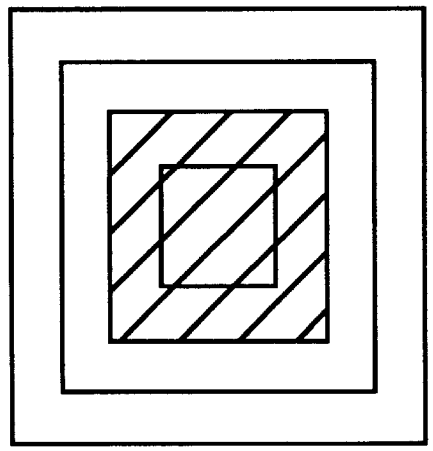
Figure 11:
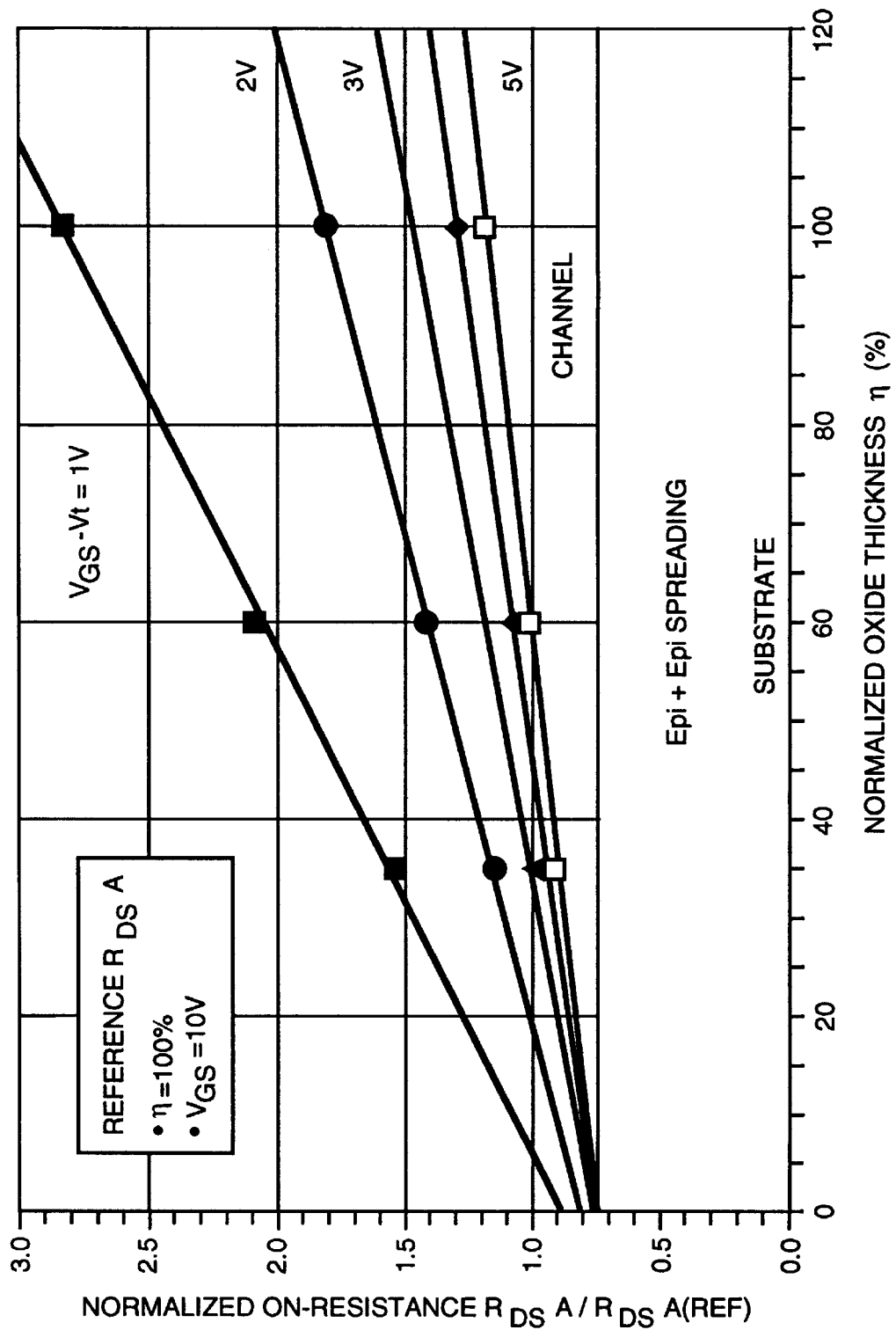
FIG. 11 is a graph showing the total normalized on-resistance as a function of the normalized gate oxide thickness for different levels of gate voltage in excess of the threshold voltage ($V_{GS}$–Vt).
Figure 13A:
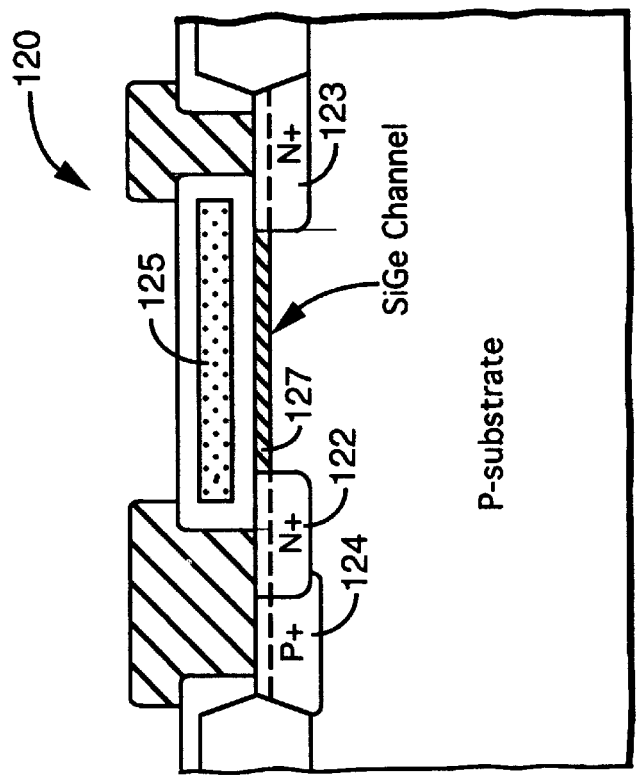
FIG. 13A shows a cross-sectional view of a lateral MOSFET containing a thin silicon-germanium layer immediately under the gate oxide layer.
Figure 12:
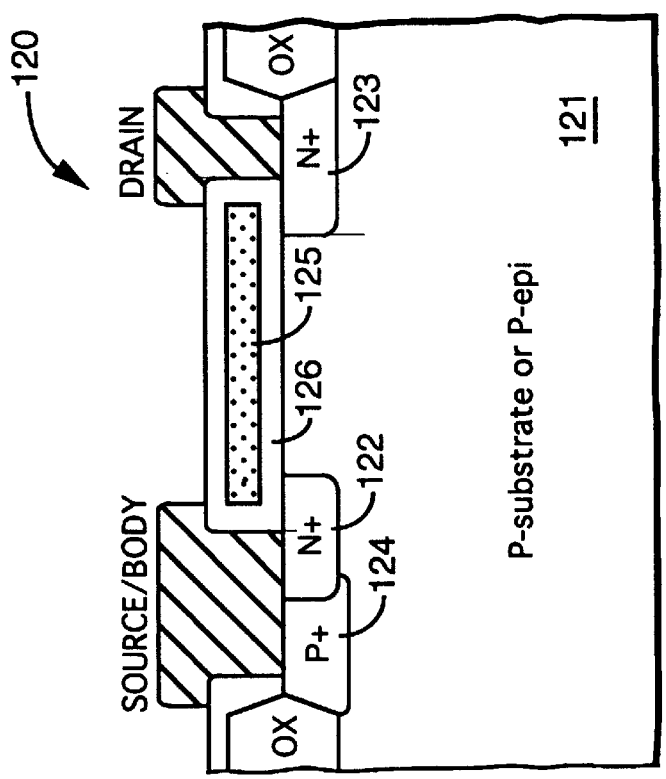
FIG. 12 shows a cross-sectional view of a lateral MOSFET.
Figure 14:
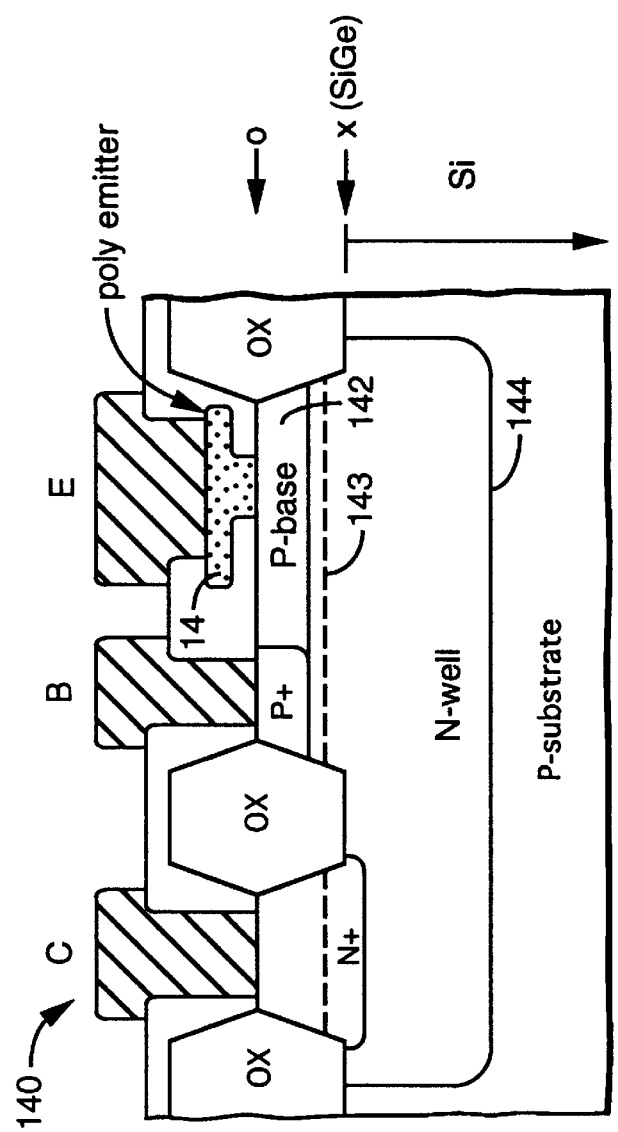
FIG. 14 shows a cross-sectional view of a high electron mobility bipolar transistor (HEMT).
Figure 13B:
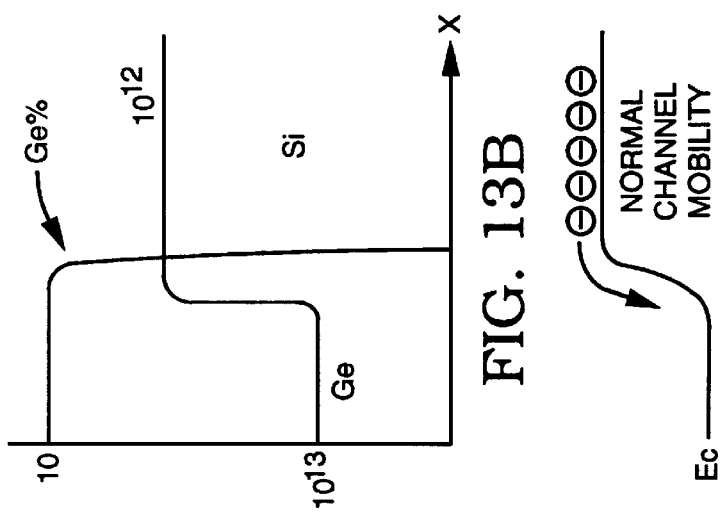
FIG. 13B shows a graph of a the doping concentration and percentage of germanium as a function of the depth below the surface in the MOSFET of FIG. 13A.
Figure 13C:
FIG. 13C is a diagram showing the lowest conduction band energy $E_c$ in the germanium and silicon regions in the MOSFET of FIG. 13A.
Figure 31A:
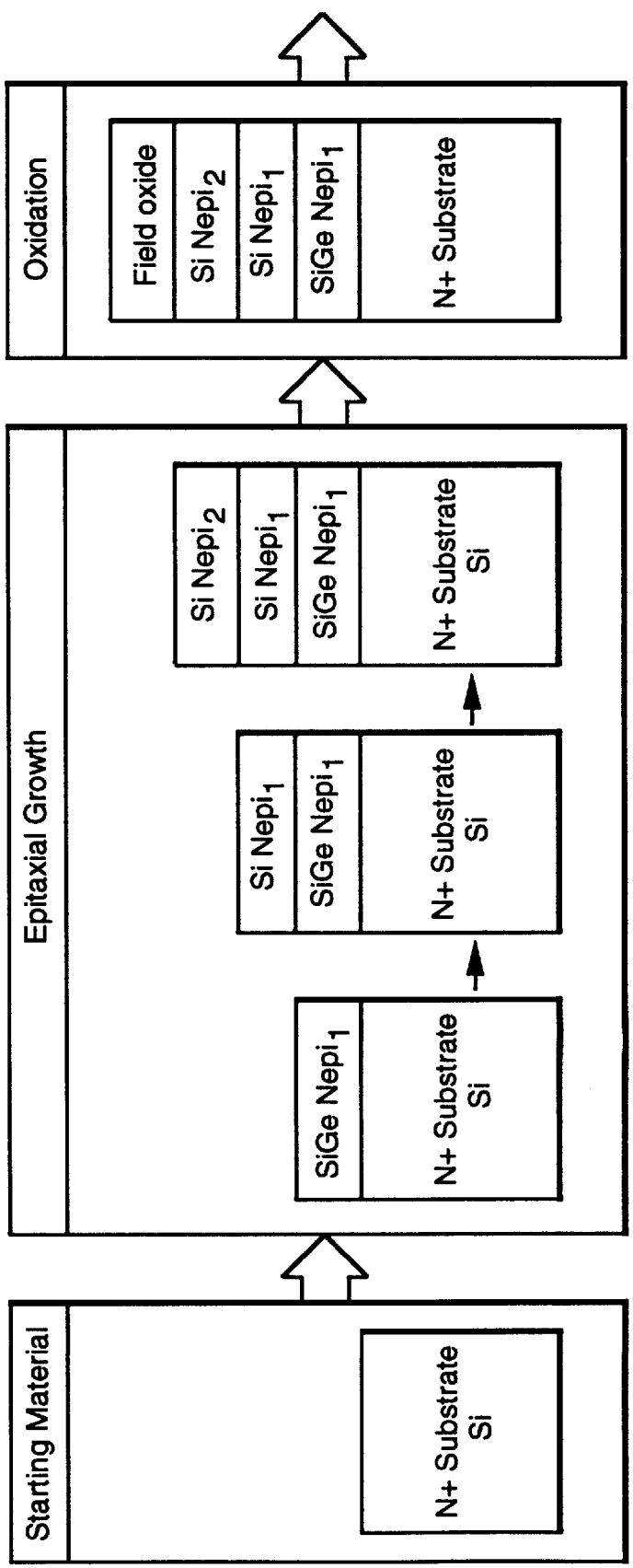
FIGS. 31A, 31B and 31C illustrate the steps of a process of fabricating a trenchFET similar to the trenchFET shown in FIG. 24.
Figure 31B:
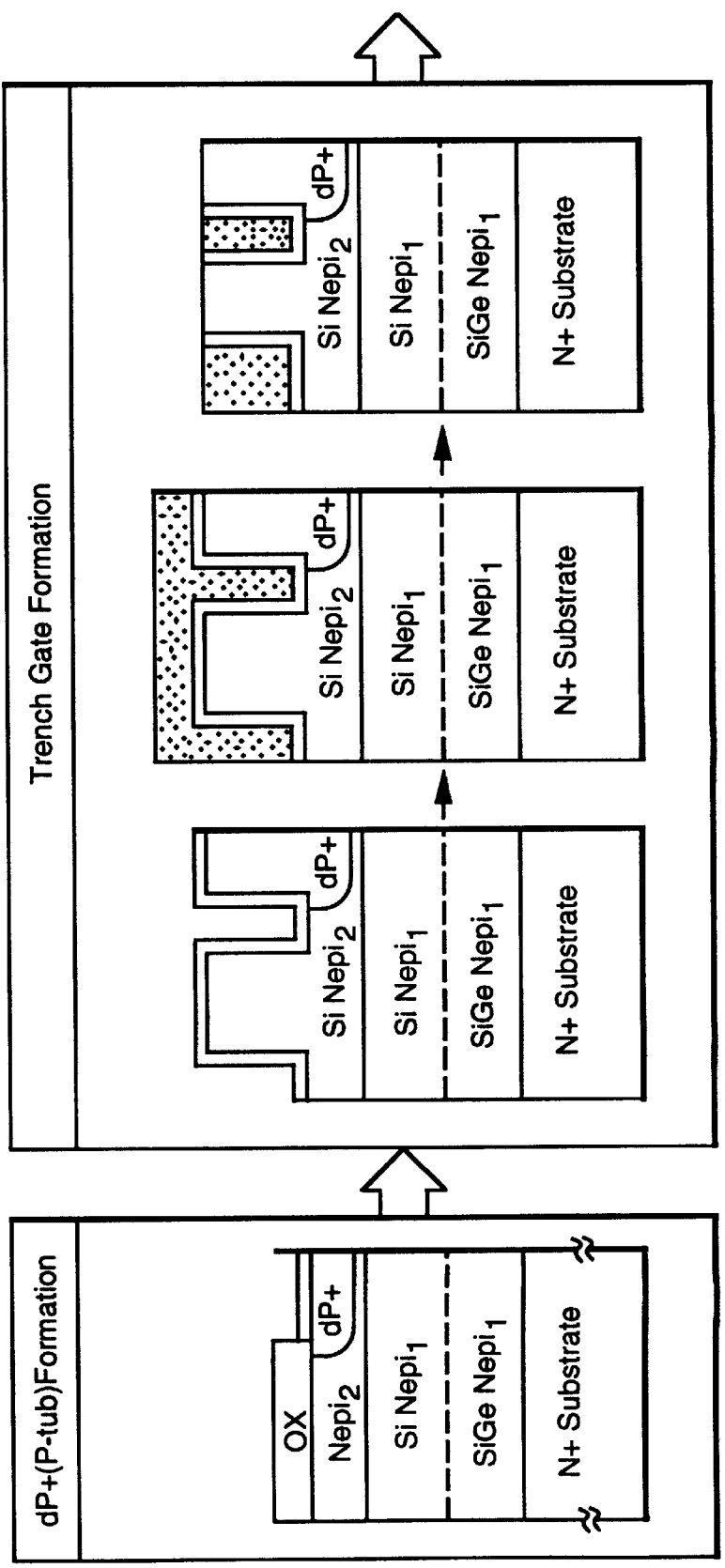
Figure 31C:
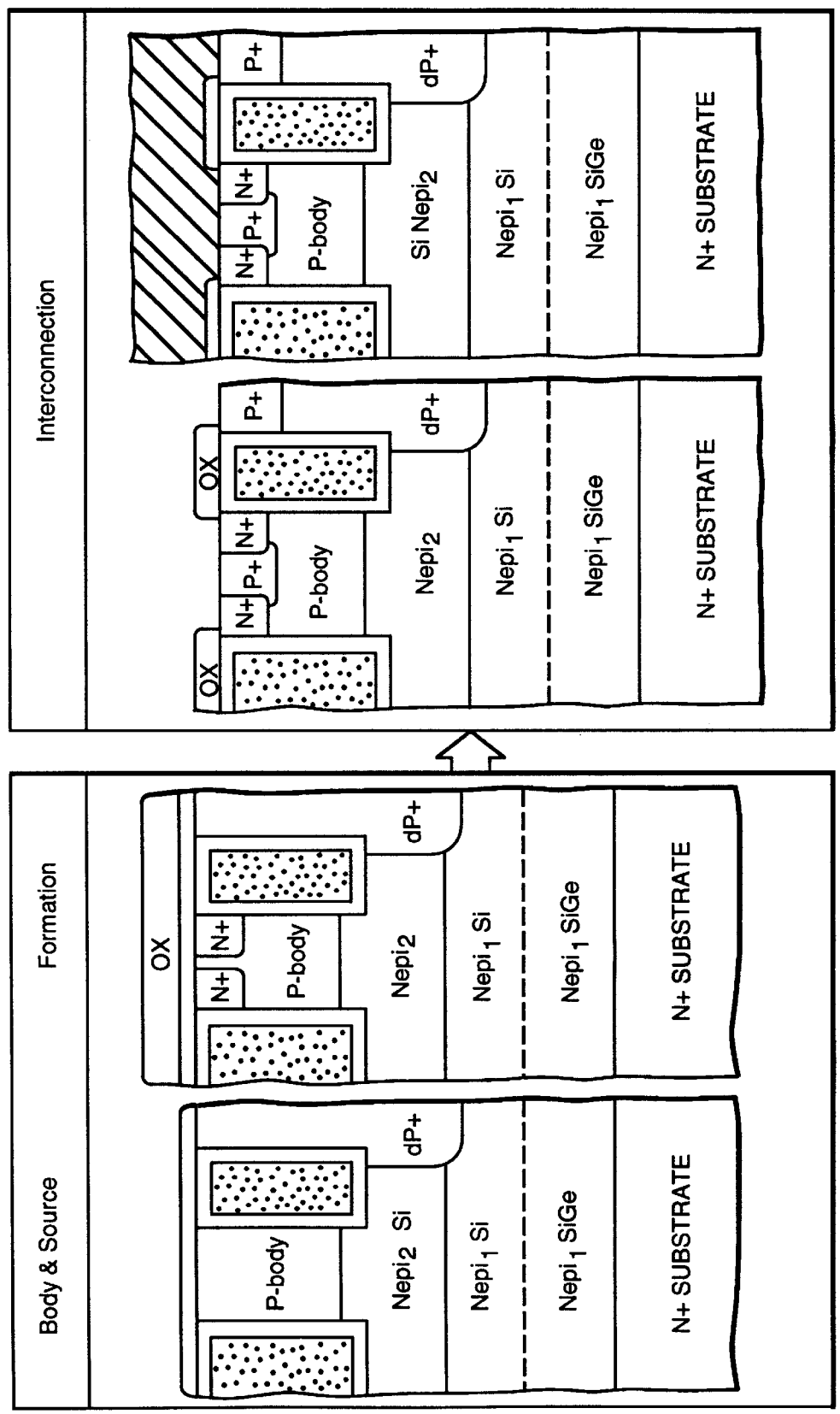

FIGS. 31A, 31B and 31C illustrate the steps of a process of fabricating a trenchFET similar to trenchFET 240 shown in FIG. 24. The starting material is a N+ silicon substrate having a resistivity of roughly 3 mΩ-cm, although the resistivity could be as high as 5 mΩ-cm or as low as 1 mΩ-cm, and the crystal is of 100 orientation. (For a P-channel device a P+ substrate having roughly the same resistivity would be used.) Then an epitaxial layer is grown on the N+ substrate, starting with a germanium-silicon mixture and finishing with pure silicon, according to one of the dopant profiles shown above (e.g., in FIG. 27). The germanium source is turned off at a point from 1 μm to several μm below the level where the bottoms of the trenches will be placed. The Si-Ge Nepi$_1$ layer is doped to a concentration in accordance with the reachthrough breakdown curves of FIG. 4 or slightly lighter-for example, $3 \times 10^{14}$ cm$^{-3}$ for a 500 V device, $4 \times 10^{15}$ cm$^{-3}$ for a 60 V device, and $4 \times 10^{16}$ cm$^{-3}$ for a 20 V device. The silicon Nepi$_2$ layer is doped anywhere up to 90% of the preceding layer but typically about 70% of the preceding layer. A field oxide layer is then grown on the top epi layer. The N-epi layers may be stepped or graded, as described above.

As shown in FIG. 31B, the field oxide layer is patterned to form an opening where the deep P+ diffusion will be located, using conventional photolithographic techniques. A thin oxide layer is grown in the opening. P-type atoms, typically boron, are implanted at a dose of 1 to $5 \times 10^{15}$ cm$^{-2}$ and driven in to a depth of 2 to 4 μm or in any event below the level of the trenches. Alternatively, a predeposition of boron at 60 to 200 Ω/square could be employed. The substrate is patterned again and the trenches are formed by reactive ion etching to a depth of from 1.7 to 6 μm. Defects are then removed by oxidizing the surface at 900 or 1000° C. for 30 minutes to 2 hours, growing a sacrificial oxide layer from a few to 1000 A thick. The sacrificial oxide layer is removed and the gate oxide is grown, taking care that some source of chlorine such as HCl or trichloroethane (TCA), a volatile solvent which decomposes at elevated temperatures to facilitate a chlorine source for improved gate oxides, is present during the oxidation process to stabilize the oxide. The oxide-lined trenches are then filled with polysilicon which is doped with phosphorus at a dosage of 1 to $5 \times 10^{15}$ cm$^{-2}$. Alternatively, the polysilicon could be doped by predeposition at 25 to 100 Ω/square. The polysilicon is then etched back to planarize the top surface. After the polysilicon gate has the top surface is subjected to an additional oxidation step to seal it, except in a region where a gate contact is to be formed.

As shown in FIG. 31C, the P-body is then implanted at a dose of from $5 \times 10^{12}$ cm$^{-2}$ to $2 \times 10^{14}$ cm$^{-2}$ and at an energy of 60 to 120 keV, either through a mask or by performing a blanket implant, resulting in a peak concentration of $5 \times 10^{15}$ cm$^{-3}$ to $8 \times 10^{16}$ cm$^{-3}$. The P-body implant is typically diffused to a level 0.3 or 0.4 μm above the bottom of the trenches. The N+ source is implanted using arsenic (or phosphorus) at a dose of $5 \times 10^{15}$ cm$^{-2}$ to $1 \times 10^{16}$ cm$^{-2}$ at 20 to 100 keV. The shallow P+ region is implanted at a dose or energy which provides a lower surface concentration than the N+ region so that the two regions can overlap. The P+ region may therefore be implanted as a blanket implant, without a mask, if so desired. The dose of the P+ region is typically $5 \times 10^{14}$ to $2 \times 10^{15}$ cm$^{-2}$ at an energy of up to 120 keV. In a P-channel device the P+ dose is higher, in the range of $1 \times 10^{15}$ to $8 \times 10^{15}$ cm$^{-2}$ and the dose of the N+ implant is lowered somewhat.

A final oxide layer is then formed by chemical vapor deposition (CVD) to a thickness of from 0.1 to 1 μm and patterned to create openings where the metal interconnect will contact the N+ source, P-body and deep P+ diffusion. In an alternative process, the P+ regions may be implanted through the windows in the contact mask. The metal layer is then deposited followed by a passivation layer of borophosphosilicate glass or silicon nitride.

Figure 32:
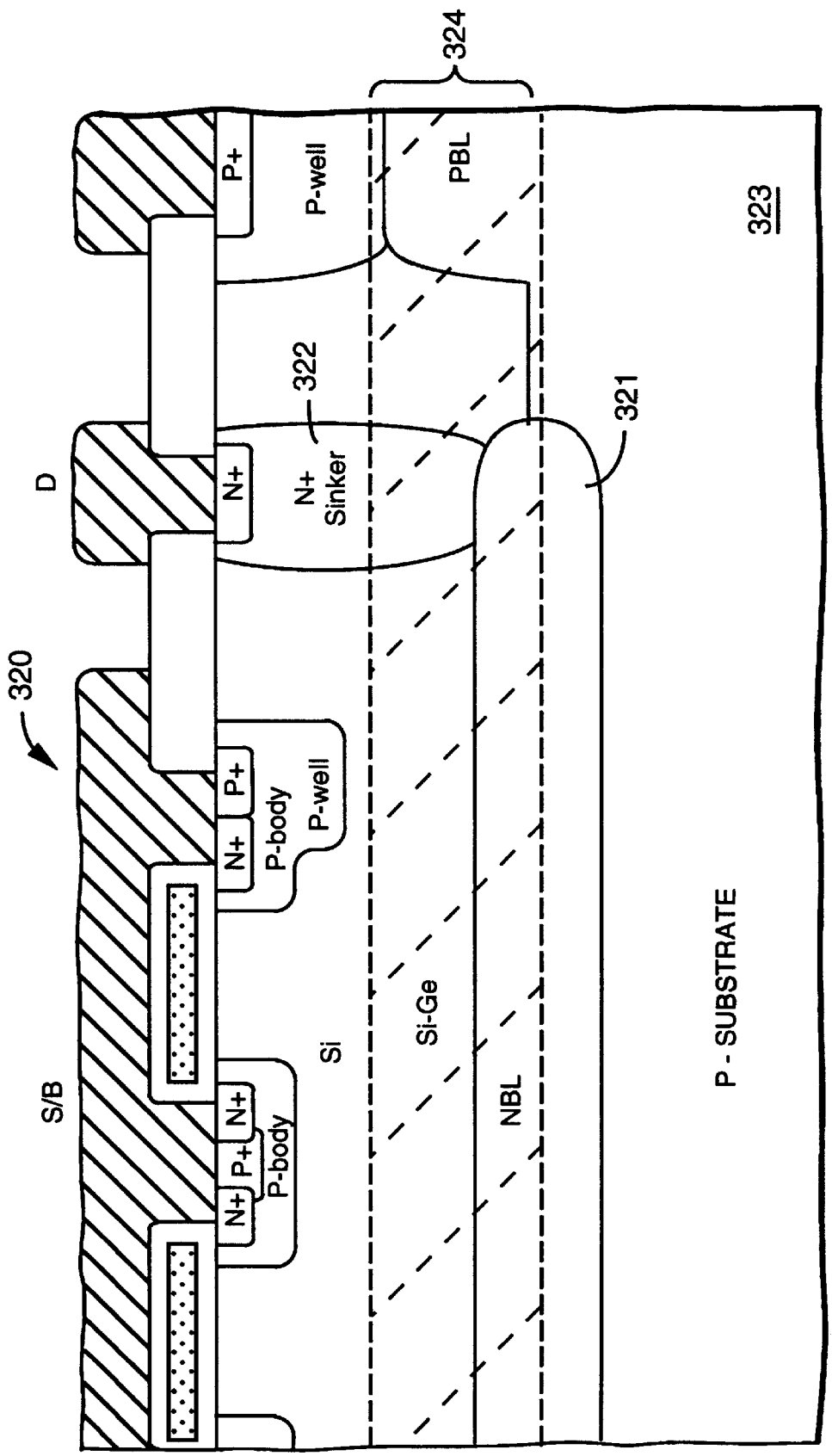
FIG. 32 shows a cross-sectional view of a quasi-vertical DMOSFET containing an Si-Ge layer and an N buried layer which is linked to the surface by an N+ sinker.

FIGS. 32–38 illustrate cross-sectional views of other devices which can use a Si-Ge layer to reduce resistance. FIG. 32 shows a quasi-vertical DMOSFET 320 containing an N buried layer 321 which is linked to the surface by an N+ sinker 322. The drain contact is made to the N+ sinker 322. The N buried layer is formed by implanting N-type dopant into the P substrate and then allowing the N-type dopant to diffuse upward as the epi layers are grown. The Si-Ge epi layer 324 is formed in the manner described above.

Figure 33:
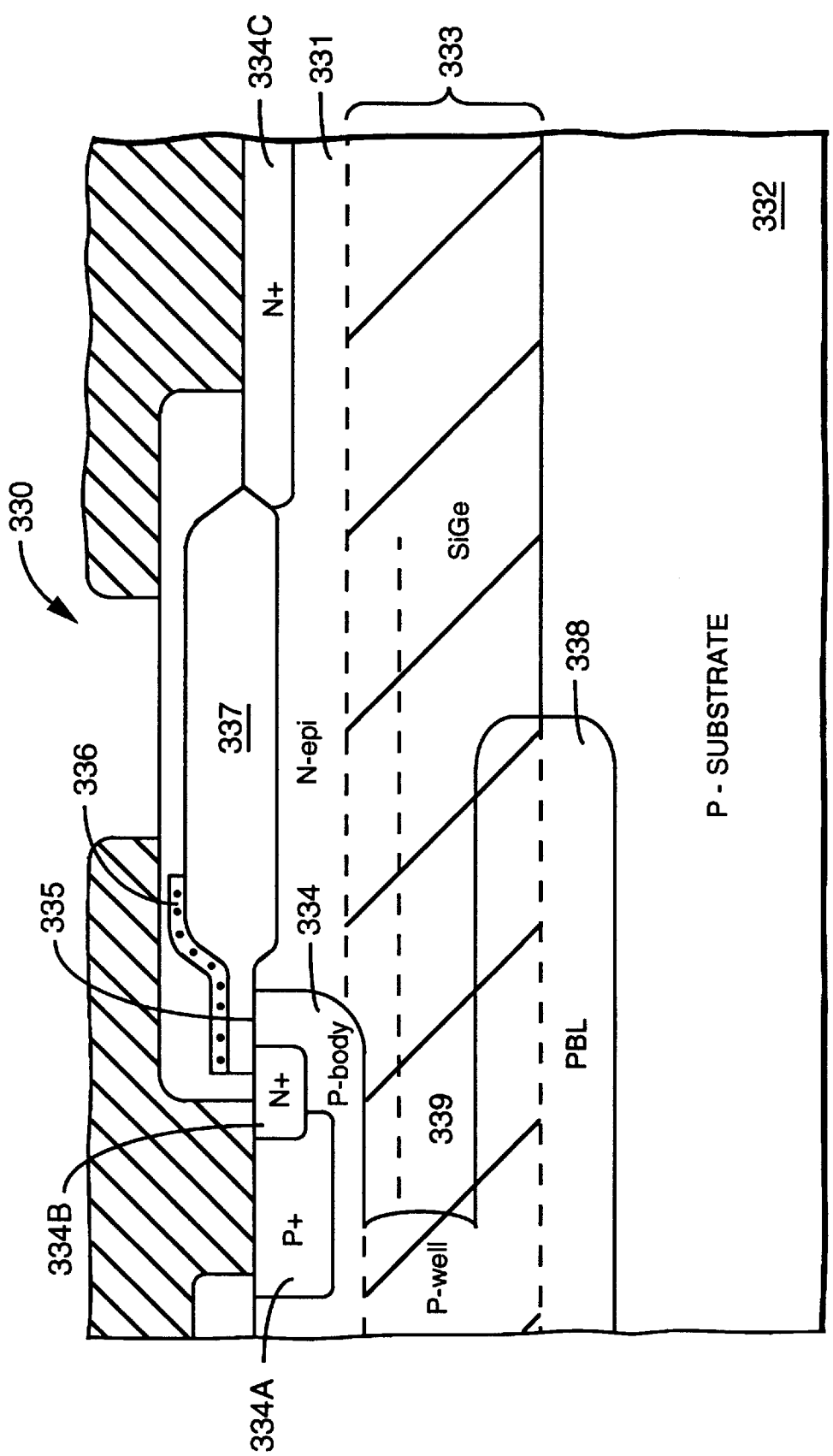
FIG. 33 shows a cross-sectional view of a lateral MOSFET with a Si-Ge layer and an N-epi layer grown on a P-type substrate.

FIG. 33 shows a lateral MOSFET 330 with an N-epi layer 331 grown on a P-type substrate 332. During part of the formation of the N-epi layer 331 a Si-Ge layer 333 is formed as described above. The N-type dopant concentration in the epi layer 331 is chosen for a given breakdown or on-resistance or it could be optimized using the resurf or lateral charge control principle so that the integrated charge of the N-epi layer 331 is roughly in the range of 1 to $3 \times 10^{12}$ cm$^{-2}$ in the drift region (the N-type layer between the bottom of the oxide layer 337 and the top of the P-buried layer 338 or the P-substrate 332). In this case, it would generally deplete before it avalanches and one can achieve a breakdown that is limited only by the one-dimensional characteristic of the N-epi layer 331 below the N+ drain contact region 334C which could be hundreds of volts. Si-Ge layer 333 helps to reduce the lateral on-resistance and yet it is held below the surface and stays out of the P-body region and the gate oxide 335. The gate 336 steps over a field oxide region 337 in the manner common in power devices. In MOSFET 330 the current flowing between the N+ source region 334B and the N+ drain region 334C tends to be diverted downward into the Si-Ge layer 333 where the resistance is lower than in the remainder of the N-epi 331 layer. Because the Si-Ge layer 333 is held away from the surface it does not adversely influence hot carrier generation near the silicon surface of the thin gate region interposed between P-body region and the field oxide region 337.

The fabrication of MOSFET 330 starts with P substrate 332 which is doped with boron to 1 to 3 Ω-cm. A P buried layer 338 is formed by implanting boron at $1 \times 10^{14}$ cm$^{-2}$ to $5 \times 10^{15}$ cm$^{-2}$ and at 20 to 120 keV. Then N-epi layer 331 is grown to a thickness of from 1 μm to 20 or 30 μm (typically 3 to 5 μm), with part of the layer including germanium to form the Si-Ge layer 333. The thickness of N-epi layer 331 and the doping of the P-substrate 332 form a two-sided step junction which determines the maximum breakdown voltage between the drain 334C and the P-well 339 with P-substrate 332. The thickness of N-epi layer 331 has a second order effect, however, so long as the dopant level is chosen to deplete before it avalanches, since MOSFET 330 uses a charge control principle. To maintain lateral charge control the following relationship must be maintained:

$$Q_{LCC} < 1 \text{ to } 5 \times 10^{12} \text{ cm}^{-2}$$

where $$Q_{LCC} = \int_0^{X_{epi}} N_{epi}(x) dx \approx N_{epi}(ave) \cdot X_{epi}$$

After N-epi layer 331 has been grown field oxide layer 337 is grown to a thickness of about 0.5 μm, although it could be as thick as 2 μm or as thin as 0.3 μm. Field oxide layer 331 is formed by oxidizing between 30 minutes and 5 hours at 900 to 1100° C. in an oxygen or steam environment. Then field oxide layer 337 is patterned. Alternatively a LOCOS process is used to form field oxide layer 337: growing a thin oxide layer, depositing and patterning a 0.5 μm thick nitride layer, growing the oxide in the exposed areas and stripping the nitride.

After field oxide layer 337 has been formed, gate oxide layer 335 is formed to a thickness of from 100 to 1000 Angstroms by oxidizing the silicon surface in dry oxygen at 850 to 1100° C. from 30 minutes to 5 hours (typically from 900 to 1000° C. for a thickness of from 175 to 400 Angstroms). Then the polysilicon gate 336 is deposited, doped with N-type dopant as described above, and patterned. The surface is masked with photoresist to implant the P-body region 334 in selected regions at a dose of $5 \times 10^{13}$ cm$^{-2}$ to $2 \times 10^{14}$ cm$^{-2}$ for 2 to 14 hours at 1050 to 1200° C. A subsequent mask is used for the P+ body contact region 334A which is implanted at a dose of $8 \times 10^{14}$ cm$^{-2}$ to $3 \times 10^{15}$ cm$^{-2}$ at 20 to 100 keV (typically 60 keV). The N+ source 334B region and the N+ drain reion 334C are implanted with arsenic at a dose of $5 \times 10^{15}$ cm$^{-2}$ (possibly as high as $1 \times 10^{16}$ cm$^{-2}$) and at 60 to 100 keV. N+ source region 334B is self-aligned to the gate 336 and N+ drain region 334C is self-aligned to the field oxide layer 337. Next the device is heated at 900° C. for 15 to 30 minutes to grow an additional oxide layer and diffuse the N+ source region 334B and N+ drain region 334C. A layer of borophosphosilicate glass (BPSG) is deposited to a thickness of 0.3 to 1.5 μm (typically 0.6 μm) and etched to create openings for the metal interconnect layers. Subsequently, one, two or three layers of metal interconnect are deposited, separated by intervening layers of BPSG or undoped glass. The BPSG or glass layers can be spun on or deposited by CVD.

Figure 34:
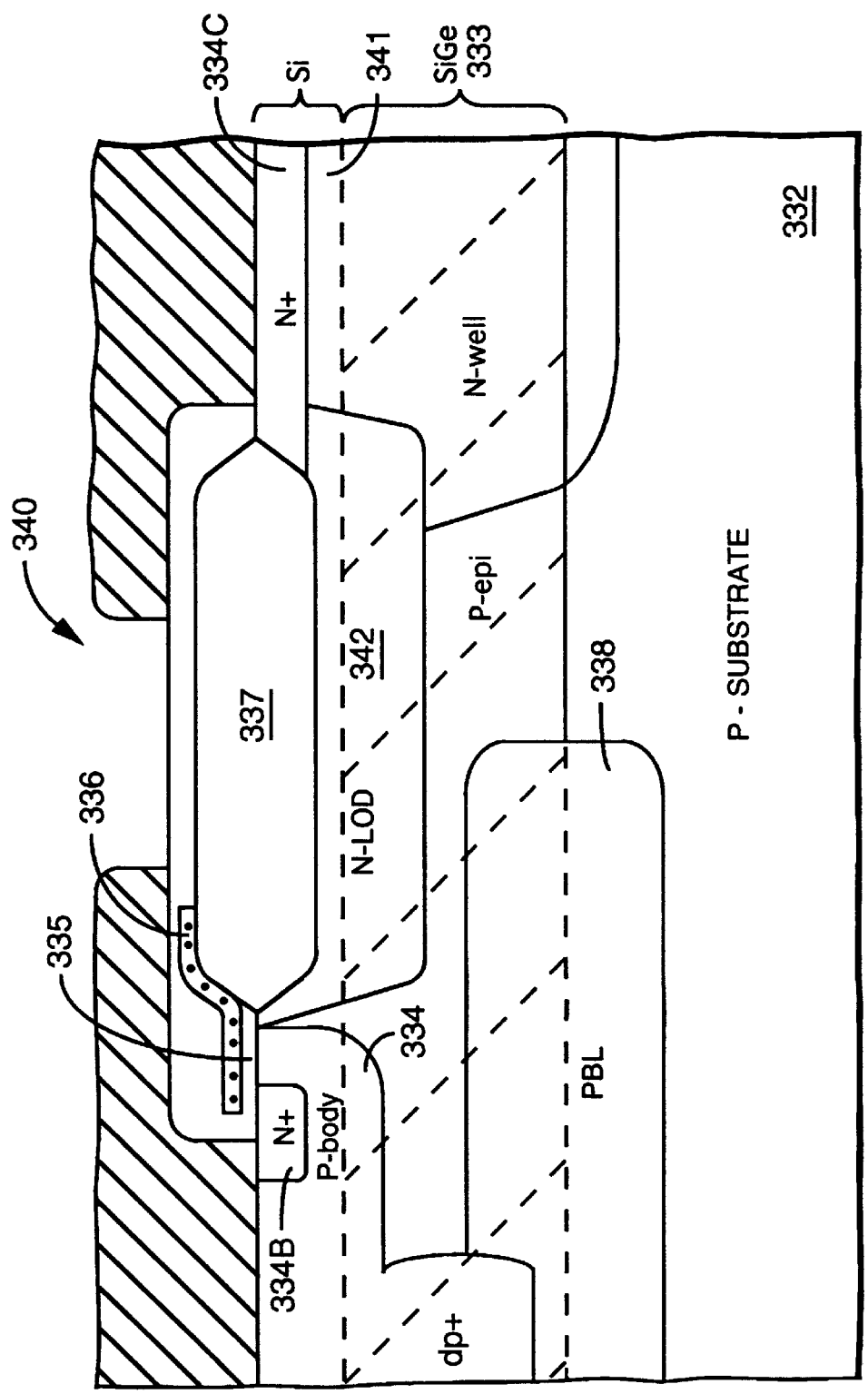
FIG. 34 illustrates a cross-sectional view of a lateral MOSFET which is similar to the MOSFET shown in FIG. 33 except that a P-type epi layer is grown over the P substrate.

FIG. 34 illustrates a lateral MOSFET 340 which is similar except that in this embodiment a P-type epi layer 341 is grown over the P substrate 332. The function of the P buried layer 338 is still to shape the electric field, but an N-type lightly-doped drain region 342 is formed not with the growth of the epi layer but by implantation. Region 342 tightly hugs the bottom of the field oxide region 337 and the current flows through the channel region in the P-body region 334 and the Si-Ge layer 333 and into the lightly-doped drain region 342. The Si-Ge layer 333 extends up into the lightly-doped drain region 342, so the germanium is closer to the surface and must be controlled so that it does not get into the gate oxide 335. One could also form Si-Ge layer 333 by implantation rather than with the growth of the P-epi layer 341. Implantation can be performed at 60 to 200 keV but requires a dose over $10^{20}$ cm$^{-2}$. Alternatively, field oxide region 337 may be made thin so that the polysilicon gate remains flat without the oxide step.

Figure 35:
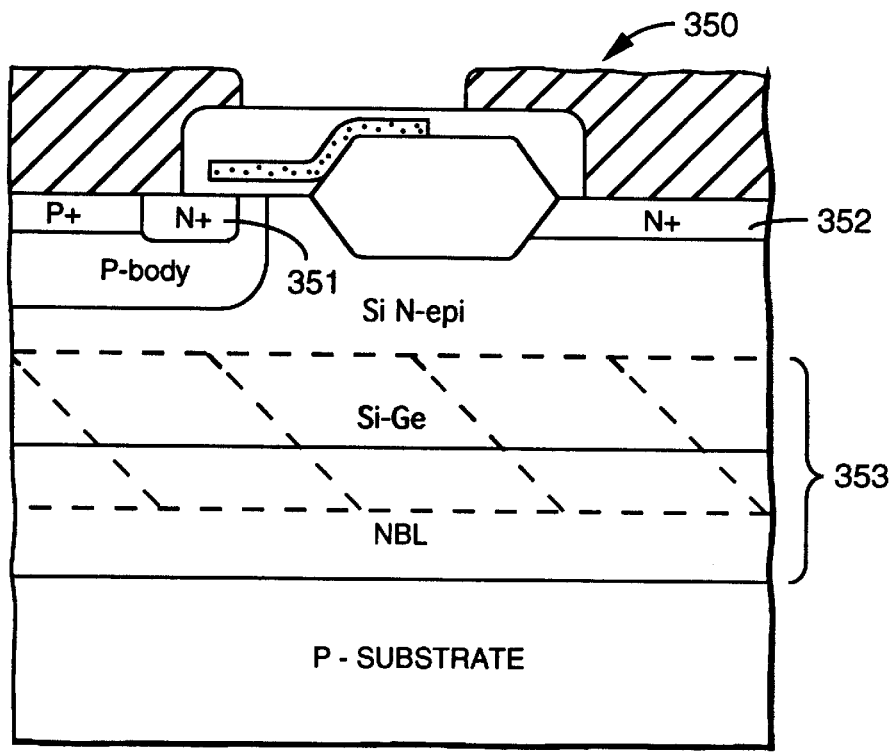
FIG. 35 shows a cross-sectional view of a classic lateral device that is similar to the MOSFET shown in FIG. 32 except that each stripe or cell of N+ source faces a stripe or cell of N+ drain.

MOSFET 350 shown in FIG. 35 is a classic lateral device that is similar to MOSFET 320 shown in FIG. 32 except that instead of having many vertical cells and a single N+ sinker to provide a drain contact each stripe or cell of N+ source (such as N+ source region 351) faces a stripe or cell of N+ drain (such as N+ drain region 352). This structure is repeated in a regular pattern across the chip so that the current is always flowing to a separate drain contact. A multi-level metal interconnect structure is required to connect the drain and source regions. Si-Ge layer 353 operates in a manner similar to Si-Ge layer 324 in MOSFET 320 to divert the current to a region of lower resistivity.

Figure 36:
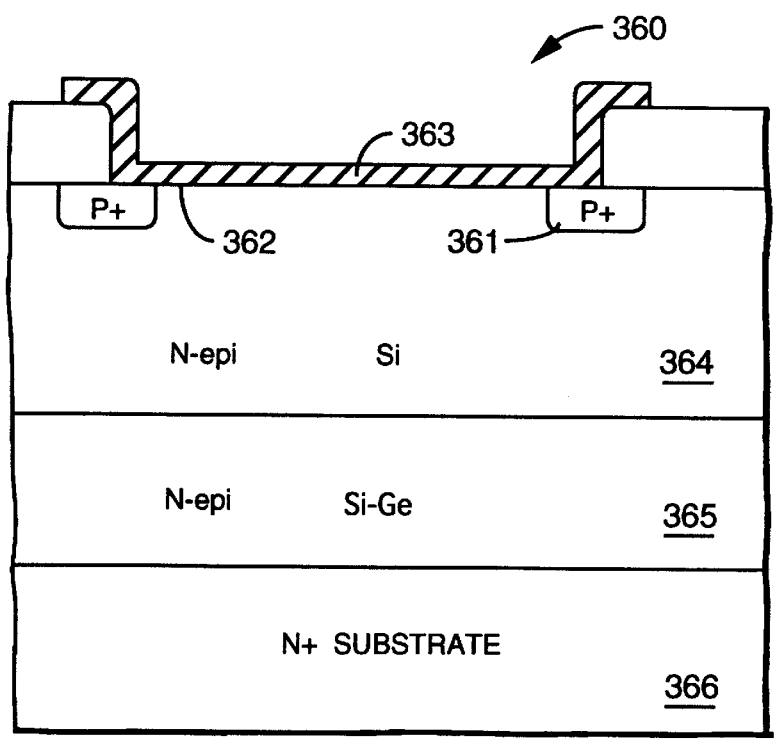
FIG. 36 shows a cross-sectional view of a Schottky diode which contains a Si-Ge layer in accordance with this invention.

The technique of this invention can be used in any device where a series resistance or field relief region must withstand a high voltage. FIG. 36 shows a Schottky diode 360 with a P+ guard ring 361 which protects a rectifying interface 362 between a metal layer 363 (e.g., platinum, titanium, or tungsten or a silicide of one of the foregoing metals) and a lightly-doped N-epi layer 364. A Si-Ge layer 365 is formed on top of an N+ substrate 366 to reduce the on-resistance of the device.

Figure 37:
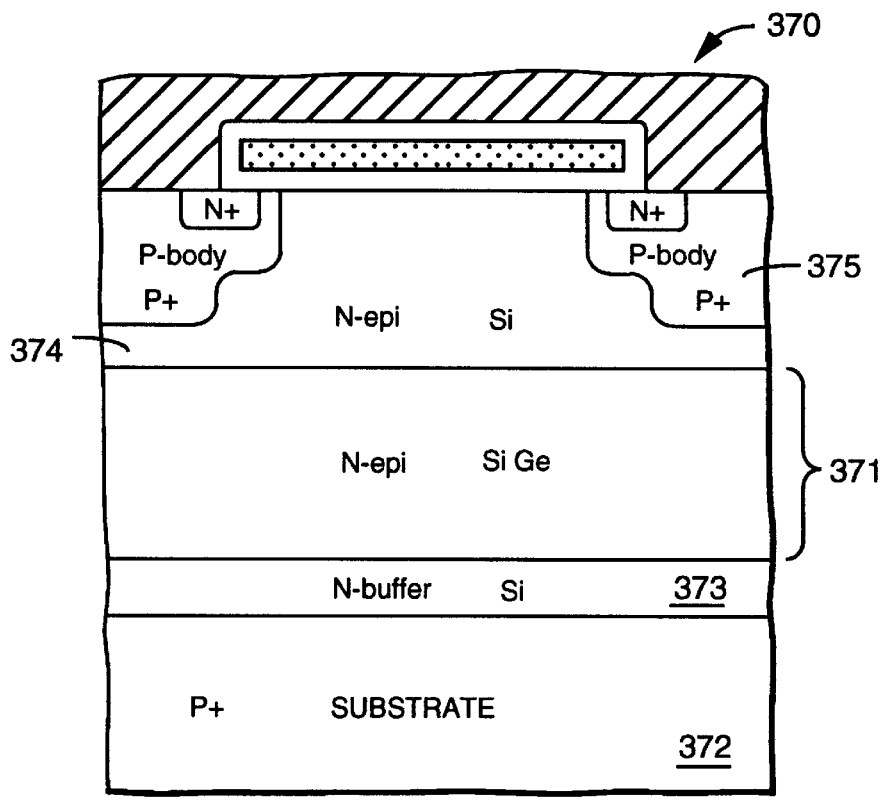
FIG. 37 shows a cross-sectional view of an insulated gate bipolar transistor (IGBT) a containing a Si-Ge layer.

The insulated gate bipolar transistor (IGBT) 370 shown in FIG. 37 is a high-voltage device which would typically have very thick layers and would be capable of withstanding 500–1000 V. Si-Ge layer 371 is preferably graded to prevent high electric fields from occurring near the surface. IGBT has a P+ substrate 372 that forms a diode with the N-buffer layer 373. This diode becomes forward-biased when the device is turned on and injects holes into N-regions, thereby modulating the conductivity and reducing the on-resistance of the device. The Si-Ge layer 371 further reduces the on-resistance. N-buffer layer 373 helps to suppress the snapback characteristic of the parasitic PNP bipolar transistor consisting of the P+ substrate 372, the N-buffer 373 and N-epi layer 374, and the P-body region 375 and also improves the punchthrough characteristic and controls the gain. The defects that may be present along the interfaces with the Si-Ge layer 371 can be beneficial in that when the device is turned off they will help promote additional recombination and will thereby reduce the turn-off time of the device as compared with a device which does not include a Si-Ge layer. So IGBT 370 simultaneously provides a reduced on-resistance and reduced turn-off time. Normally when one attempts to reduce the turn-off time the amount of conductivity modulation is lowered, which raises the voltage drop. In this case, since one is not relying totally on conductivity modulation, it is possible to achieve a compromise between the two factors. IGBT 370 could also be fabricated as a P-channel device, or without a gate as a silicon-controlled rectifier (SCR) or thyristor.

Figure 38:
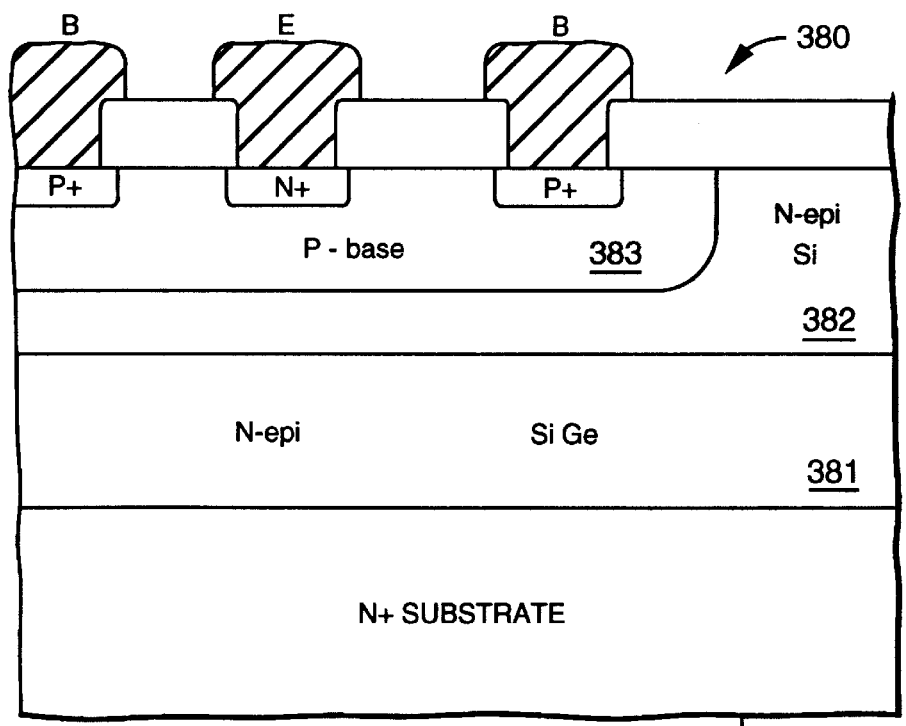
FIG. 38 shows a cross-sectional view of a bipolar transistor which contains a Si-Ge layer.

FIG. 38 shows the use of a Si-Ge layer 381 in a bipolar transistor 380. Bipolar transistor 380 has a significant resistance in its N-epi region 382 which is reduced by the Si-Ge layer 381. In this case the Si-Ge layer could extend all the way to the surface of the device because there is no gate oxide layer. However, this could cause some current leakage, so it is probably a better practice to keep the Si-Ge layer 381 out of the P-base 383. A Si-Ge layer could be used in devices that go up to 2000–3000 V.

Figure 39B:
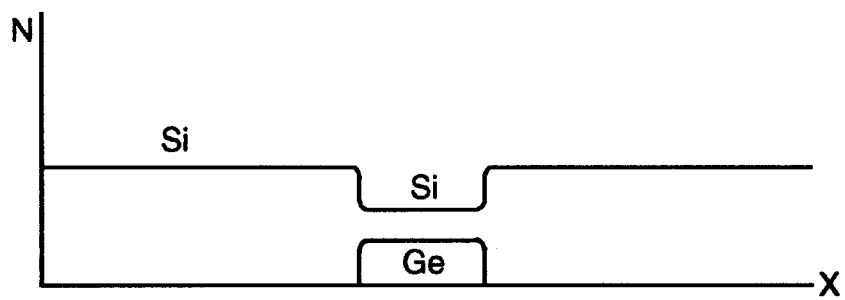
FIG. 39B illustrates a graph showing the concentrations of Si and Ge in the thyristor of FIG. 39A.
Figure 39A:
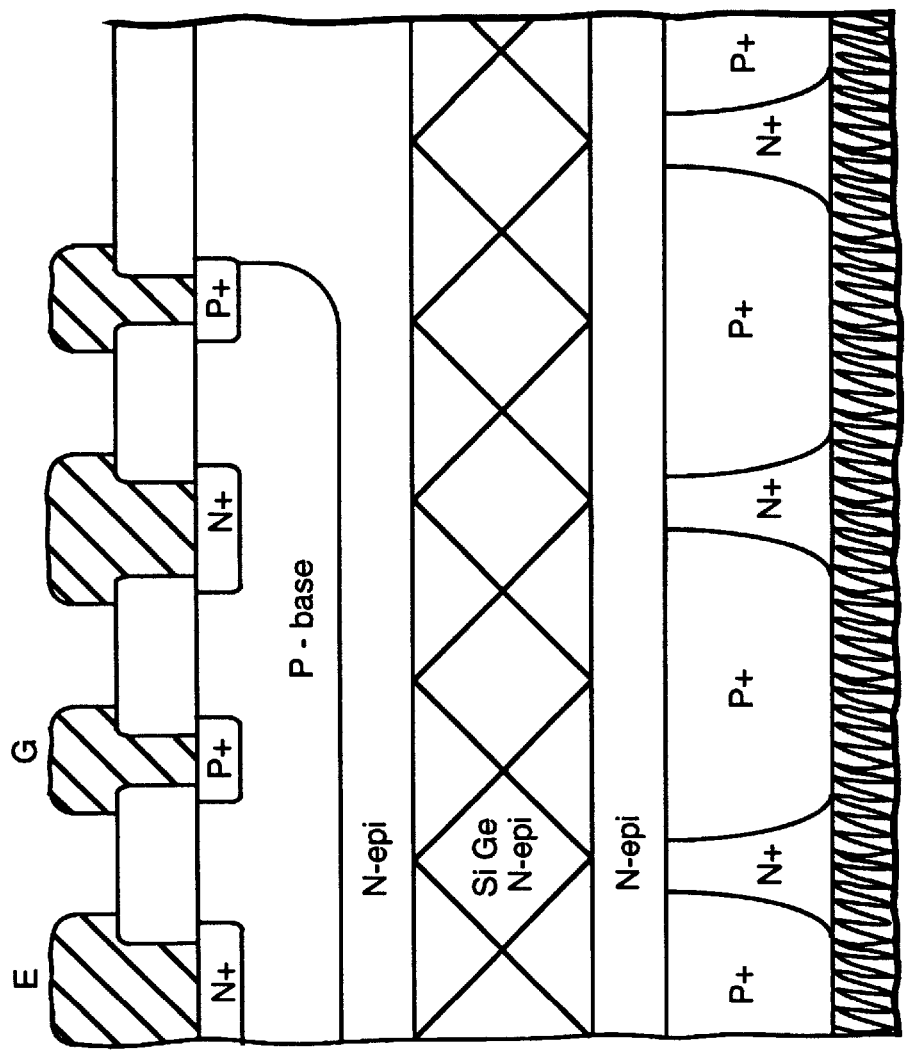
FIG. 39A illustrates a vertical thyristor with a buried region of germanium.

By adding a P+ substrate on the backside, a PNPN thyristor can be formed, as shown in FIG. 39A. Significant conduction occurs by holes in the PNP bipolar transistor formed by the backside P+, the N-epi and the P-base. The collected holes flowing in the base region create a voltage drop and allow the N+ regions to become forward-biased and to inject electrons into the P-base which are subsequently collected by the N-epi layer. The collector current (N-epi) of the NPN feeds the base of the PNP. The collector current of the PNP feeds the base of the NPN. Eventually the 4-layer sandwich becomes flooded with holes and electrons across the entire epi and P-base region whereby the device latches into an on state. By pulling the P+ contact to the P-base negative (or ideally just to zero volts), holes in the P-base do not have adequate voltage to forward-bias the N+/P-body junction, and the device, with help from the localized Si-Ge recombination layer, shuts off. The N+/P+ short reduces the sensitivity to a dV/dt transient-induced spurious turn-on. FIG. 39B is a graph showing the concentration of silicon and germanium atoms in a vertical section of the device.

Since devices such as the IGBT are susceptible to latch-up, Si-Ge layer may have the added benefit of reducing the turn-off time when they are commutating and decrease the chances of latch-up. With a switched thyristor which is intended to latch on, such as a gate turnoff thyristor (GTO) or an emitter-switched thyristor (EST), the Si-Ge layer may allow the control current to be greater, but the change in the on-resistance will not be as beneficial because these devices are so heavily conductivity-modulated that the Si-Ge layer will not change the voltage drop much, especially since an IGBT has a voltage drop in series with a device that has to be overcome before the device can begin to conduct. This drop is over 0.7 V, so that the improvement in on-resistance is minimal. In such cases the Si-Ge layer may assist more with the switching characteristic than with the on-state voltage drop. By localizing a high germanium content in the Si-Ge layer near the backside injector or deep in the bulk silicon (especially for layers with a total charge exceeding $1 \times 10^{15}$ cm$^{-3}$), a faster and more uniform turnoff can be achieved.

Germanium has a different band gap and a different work function than silicon. Thus there is a built-in energy difference between pure silicon and a combination of silicon and germanium. As the content of the germanium in the Si-Ge layer increases the height of the energy barrier represented by the Si-Ge layer increases and this energy barrier eventually begins to suppress conduction across the barrier and the on-state voltage drop across the device begins to increase rather than decrease. It is currently believed that this phenomenon sets an upper limit in the range of 35–40% germanium. The liklihood is that this is not the effective upper limit for germanium content because the problem of defects in the crystalline structure probably will occur before the energy barrier problem, although in time materials engineering and process technology may surmount the difficulties with process-induced defects.

While specific embodiments of this invention have been described, such embodiments should be considered as illustrative rather than limiting. For example, the polarities of the embodiments described can be switched, with P-type regions becoming N-type regions, and vice-versa. The principles of this invention are applicable to numerous embodiments in addition to those described herein.

What is claimed is:

1. A power MOSFET comprising:
   an epitaxial layer formed on a surface of a substrate;
   a source region of a first conductivity type formed in said epitaxial layer;
   a body region of a second conductivity type opposite to said first conductivity type formed in said epitaxial layer, said body region being located adjacent said source region and including a channel region;
   a drain region of the first conductivity type comprising said substrate layer and at least a portion of said epitaxial layer;

a gate, said channel region being separated from said gate by a dielectric layer; and a Si-Ge layer comprising germanium atoms, said Si-Ge layer being formed in at least a portion of said epitaxial layer and extending to a surface of said epitaxial layer, said Si-Ge layer being substantially thicker than said channel region.

2. The power MOSFET of claim 1 wherein a dopant concentration of atoms of said first conductivity type is constant throughout most of a vertical section of said epitaxial layer which does not transect either said body region or said source region and a concentration of germanium atoms is constant throughout most of said vertical section.

3. The power MOSFET of claim 1 wherein a dopant concentration of atoms of said first conductivity type is constant throughout most of a vertical section of said epitaxial layer which does not transect either said body region or said source region and a concentration of germanium atoms varies gradually along most of said vertical section.

4. The power MOSFET of claim 1 wherein a dopant concentration of atoms of said first conductivity type is constant throughout most of a vertical section of said epitaxial layer which does not transect either said body region or said source region and a concentration of germanium atoms is stepped along most of said vertical section.

5. The power MOSFET of claim 1 wherein a dopant concentration of atoms of said first conductivity type varies gradually along most of a vertical section which does not transect either said body region or said source region and a concentration of germanium atoms is constant throughout most of said vertical section.

6. The power MOSFET of claim 1 wherein a dopant concentration of atoms of said first conductivity type varies gradually along most of a vertical section which does not transect either said body region or said source region and a concentration of germanium atoms varies gradually along most of said vertical section.

7. The power MOSFET of claim 1 wherein a dopant concentration of atoms of said first conductivity type varies gradually along most of a vertical section which does not transect either said body region or said source region and a concentration of germanium atoms is stepped along most of said vertical section.

8. The power MOSFET of claim 1 wherein a dopant concentration of atoms of said first conductivity type is stepped along most of a vertical section which does not transect either said body region or said source region and a concentration of germanium atoms is constant throughout most of said vertical section.

9. The power MOSFET of claim 1 wherein a dopant concentration of atoms of said first conductivity type is stepped along most of a vertical section which does not transect either said body region or said source region and a concentration of germanium atoms varies gradually along most of said vertical section.

10. The power MOSFET of claim 1 wherein a dopant concentration of atoms of said first conductivity type is stepped along most of a vertical section which does not transect either said body region or said source region and a concentration of germanium atoms is stepped along most of said vertical section.

11. The power MOSFET of claim 1 comprising a vertical current flow device fabricated in said epitaxial layer.

12. The power MOSFET of claim 1 wherein the content of germanium in said Si-Ge layer is between 2% and 40%.

13. The power MOSFET of claim 1 wherein said Si-Ge layer is more than 2 $\mu$m thick.

14. The power MOSFET of claim 1 wherein a gradient of the germanium content in said Si-Ge layer is less than or equal to 4%/$\mu$m.

15. The power MOSFET of claim 1 comprising a lateral current flow device fabricated in said epitaxial layer.

16. The power MOSFET of claim 15 wherein the content of germanium in said Si-Ge layer is between 2% and 40%.

17. The power MOSFET of claim 15 wherein said Si-Ge layer is more than 2 $\mu$m thick.

18. The power MOSFET of claim 15 wherein a gradient of the germanium content in said Si-Ge layer is less than or equal to 4%/$\mu$m.

19. A power MOSFET comprising:

an epitaxial layer formed on a surface of a substrate;

a source region of a first conductivity type formed in said epitaxial layer;

a body region of a second conductivity type opposite to said first conductivity type formed in said epitaxial layer, said body region being located adjacent said source region and including a channel region;

a drain region of the first conductivity type comprising said substrate layer and at least a portion of said epitaxial layer;

a gate, said channel region being separated from said gate by a dielectric layer; and a Si-Ge layer comprising germanium atoms, said Si-Ge layer being formed in a portion of said epitaxial layer and not extending to a surface of said epitaxial layer.

20. The power MOSFET of claim 19 wherein a dopant concentration of atoms of said first conductivity type is constant throughout most of a vertical section of said epitaxial layer which does not transect either said body region or said source region and a concentration of germanium atoms is substantially constant along a vertical section of said Si-Ge layer.

21. The power MOSFET of claim 19 wherein a dopant concentration of atoms of said first conductivity type is constant throughout most of a vertical section of said epitaxial layer which does not transect either said body region or said source region and a concentration of germanium atoms varies gradually along a vertical section of said Si-Ge layer.

22. The power MOSFET of claim 19 wherein a dopant concentration of atoms of said first conductivity type is constant throughout most of a vertical section of said epitaxial layer which does not transect either said body region or said source region and a concentration of germanium atoms is stepped along a vertical section of said Si-Ge layer.

23. The power MOSFET of claim 19 wherein a dopant concentration of atoms of said first conductivity type varies gradually along most of a vertical section which does not transect either said body region or said source region and a concentration of germanium atoms is constant along a vertical section of said Si-Ge layer.

24. The power MOSFET of claim 19 wherein a dopant concentration of atoms of said first conductivity type varies gradually along most of a vertical section which does not transect either said body region or said source region and a concentration of germanium atoms varies gradually along a vertical section of said Si-Ge layer.

25. The power MOSFET of claim 19 wherein a dopant concentration of atoms of said first conductivity type varies gradually along most of a vertical section which does not transect either said body region or said source region and a concentration of germanium atoms is stepped along a vertical section of said Si-Ge layer.

26. The power MOSFET of claim 19 wherein a dopant concentration of atoms of said first conductivity type is stepped along most of a vertical section which does not transect either said body region or said source region and a concentration of germanium atoms is substantially constant along a vertical section of said Si-Ge layer.

27. The power MOSFET of claim 19 wherein a dopant concentration of atoms of said first conductivity type is stepped along most of a vertical section which does not transect either said body region or said source region and a concentration of germanium atoms varies gradually along a vertical section of said Si-Ge layer.

28. The power MOSFET of claim 19 wherein a dopant concentration of atoms of said first conductivity type is stepped along most of a vertical section which does not transect either said body region or said source region and a concentration of germanium atoms is stepped along a vertical section of said Si-Ge layer.

29. The power MOSFET of claim 19 comprising a vertical current flow device fabricated in said epitaxial layer.

30. The power MOSFET of claim 29 wherein the content of germanium in said Si-Ge layer is between 2% and 40%.

31. The power MOSFET of claim 29 wherein said Si-Ge layer is more than 2 µm thick.

32. The power MOSFET of claim 29 wherein a gradient of the germanium content in said Si-Ge layer is less than or equal to 4%/µm.

33. The power MOSFET of claim 19 comprising a lateral current flow device fabricated in said epitaxial layer.

34. The power MOSFET of claim 33 wherein the content of germanium in said Si-Ge layer is between 2% and 40%.

35. The power MOSFET of claim 33 wherein said Si-Ge layer is more than 2 µm thick.

36. The power MOSFET of claim 33 wherein a gradient of the germanium content in said Si-Ge layer is less than or equal to 4%/µm.

37. The power MOSFET of claim 19 comprising an oxide layer on a surface of said epitaxial layer, said oxide layer being substantially free of germanium atoms.

38. The power MOSFET of claim 19 wherein said dielectric layer comprises a gate oxide layer, said gate oxide layer being substantially free of germanium atoms.

39. The power MOSFET of claim 38 wherein said gate is formed in a trench.

40. The power MOSFET of claim 39 wherein said trench does not extend into said Si-Ge layer.

41. The power MOSFET of claim 39 wherein said Si-Ge layer does not extend into said body region.

42. The power MOSFET of claim 39 comprising a diffusion of said second conductivity type which forms a clamping diode with a portion of said epitaxial layer of said first conductivity type, said Si-Ge layer extending into said diffusion.

43. The power MOSFET of claim 39 comprising a diffusion of said second conductivity type which forms a clamping diode with a portion of said epitaxial layer of said first conductivity type, said Si-Ge layer not extending into said diffusion.

44. The power MOSFET of claim 19 comprising:
a trench extending downward from a top surface of said epitaxial layer, a wall of said trench being lined with said dielectric layer, said gate being formed in said trench;
wherein said source region is formed adjacent said top surface of said epitaxial layer and
said channel region is separated from said gate by said dielectric layer.

45. The power MOSFET of claim 44 wherein a concentration of germanium atoms in said Si-Ge layer is substantially constant throughout said Si-Ge layer.

46. The power MOSFET of claim 44 wherein a concentration of germanium atoms in said Si-Ge layer varies at different levels of said Si-Ge layer.

47. The power MOSFET of claim 44 wherein said Si-Ge layer extends to said top surface of said epitaxial layer.

48. The power MOSFET of claim 44 wherein said Si-Ge layer does not extend to said top surface of said epitaxial layer.

49. The power MOSFET of claim 44 comprising a MOSFET cell bounded on at least two sides by said trench and a deep diffusion of said second conductivity type located substantially at a center of said MOSFET cell and extending to a level below a bottom of said trench.

50. The power MOSFET of claim 49 comprising a plurality of said MOSFET cells, each of said MOSFET cells being bounded on at least two sides by said trench, and a diffusion of said second conductivity type spaced apart from said MOSFET cells, a PN junction at a border of said diffusion forming a clamping diode.

51. The power MOSFET of claim 49 comprising a plurality of said diffusions, said diffusions being located at periodic intervals across a surface of said trenchFET.

52. The power MOSFET of claim 49 wherein said MOSFET cell is bounded on all sides by said trench.

53. The power MOSFET of claim 49 wherein said MOSFET cell is in the form of an elongated strip.

54. The power MOSFET of claim 44 wherein said body region is fully depleted.

55. An ACCUFET comprising:
an epitaxial layer formed on a surface of a substrate;
a trench extending downward from a top surface of said epitaxial layer, a wall of said trench being lined with a dielectric layer, a gate being formed in said trench;
a mesa formed between at least two segments of said trench;
a first region of the first conductivity type comprising said substrate layer and at least a portion of said epitaxial layer; and
a second region of a first conductivity type formed adjacent said top surface of said epitaxial layer in said mesa, said second region being doped more heavily than said first region;
a Si-Ge layer comprising germanium atoms, said Si-Ge layer being formed in at least a portion of said epitaxial layer.

56. The power MOSFET of claim 19 wherein said power MOSFET comprises a planar vertical double-diffused MOSFET and wherein:
said epitaxial layer is of a first conductivity type;
said source region is formed in said epitaxial layer adjacent a top surface of said epitaxial layer;
said body region is adjacent said top surface of said epitaxial layer and encloses said source region and said channel region extends parallel to said top surface.

57. The power MOSFET of claim 56 wherein a concentration of germanium atoms in said Si-Ge layer is substantially constant throughout said Si-Ge layer.

58. The power MOSFET of claim 56 wherein a concentration of germanium atoms in said Si-Ge layer varies at different levels of said Si-Ge layer.

59. The power MOSFET of claim 56 wherein said Si-Ge layer extends to said top surface of said epitaxial layer.

60. The power MOSFET of claim 56 wherein said Si-Ge layer does not extend to said top surface of said epitaxial layer.

* * * * *